United States Patent
Matsumura

(10) Patent No.: US 9,159,879 B2
(45) Date of Patent: Oct. 13, 2015

(54) SEMICONDUCTOR LIGHT EMITTING ELEMENT

(71) Applicant: NICHIA CORPORATION, Anan-shi, Tokushima (JP)

(72) Inventor: Hiroaki Matsumura, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/189,207

(22) Filed: Feb. 25, 2014

(65) Prior Publication Data

US 2014/0239341 A1 Aug. 28, 2014

(30) Foreign Application Priority Data

Feb. 28, 2013 (JP) .................................. 2013-039587
Feb. 21, 2014 (JP) .................................. 2014-031939

(51) Int. Cl.

| H01L 33/00 | (2010.01) |
|---|---|
| H01L 33/36 | (2010.01) |
| H01L 33/20 | (2010.01) |
| H01L 33/38 | (2010.01) |
| H01L 33/22 | (2010.01) |
| H01L 33/44 | (2010.01) |

(52) U.S. Cl.
CPC ................ *H01L 33/36* (2013.01); *H01L 33/20* (2013.01); *H01L 33/382* (2013.01); *H01L 33/22* (2013.01); *H01L 33/44* (2013.01); *H01L 2924/0002* (2013.01); *H01L 2933/0016* (2013.01)

(58) Field of Classification Search
USPC .......................................................... 257/99
See application file for complete search history.

(56) References Cited

U.S. PATENT DOCUMENTS

| 2011/0049537 A1 | 3/2011 | Lee et al. |
| 2011/0049555 A1 | 3/2011 | Engl et al. |
| 2012/0007118 A1 | 1/2012 | Choi et al. |
| 2012/0168712 A1 | 7/2012 | Fang et al. |
| 2012/0235168 A1 | 9/2012 | Katsuno et al. |
| 2013/0087814 A1 | 4/2013 | Moon et al. |

FOREIGN PATENT DOCUMENTS

| JP | 2011-054967 A | 3/2011 |
| JP | 2011-517064 A | 5/2011 |
| JP | 2011-198997 A | 10/2011 |
| JP | 2011-216524 A | 10/2011 |
| JP | 2012-195321 A | 10/2012 |
| JP | 2012-227311 A | 11/2012 |

*Primary Examiner* — Marvin Payen
(74) *Attorney, Agent, or Firm* — Squire Patton Boggs (US) LLP

(57) ABSTRACT

The light emitting element including: a semiconductor laminate including a first layer, an active layer and a second layer; a first electrode including protrusions that penetrate the second layer and the active layer, the first electrode connected to the first layer via the protrusions; a second electrode connected to the second layer on an lower face of the second layer; and an insulation film between the protrusions and the semiconductor laminate, wherein the protrusions each include a protrusion body covered with the insulation film and a protrusion tip, an upper face and a side face of the protrusion tip being exposed from the insulation film, the first layer includes recesses arranged on an upper face of the first layer so as to sandwich first areas located above the respective the protrusions, and a distance between the recesses sandwiching the first area is larger than a width of the protrusion tip.

8 Claims, 12 Drawing Sheets

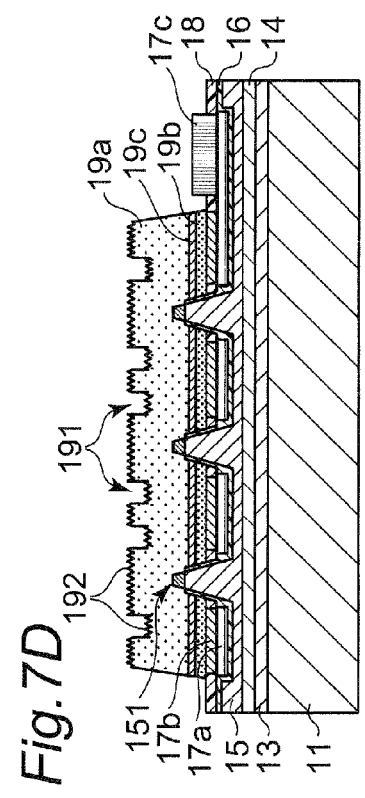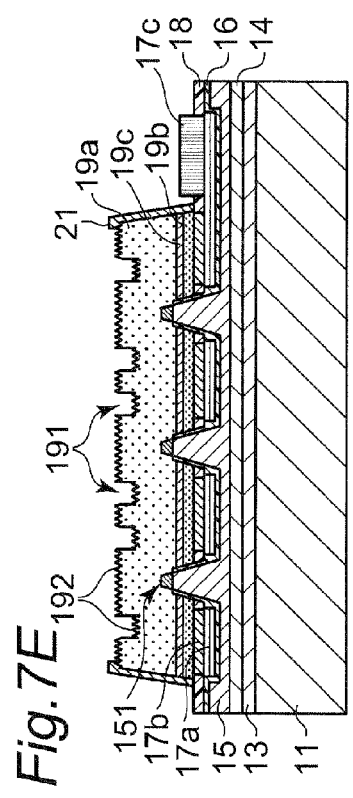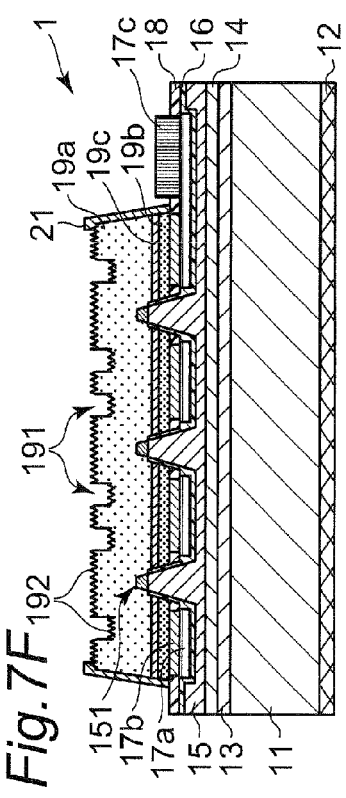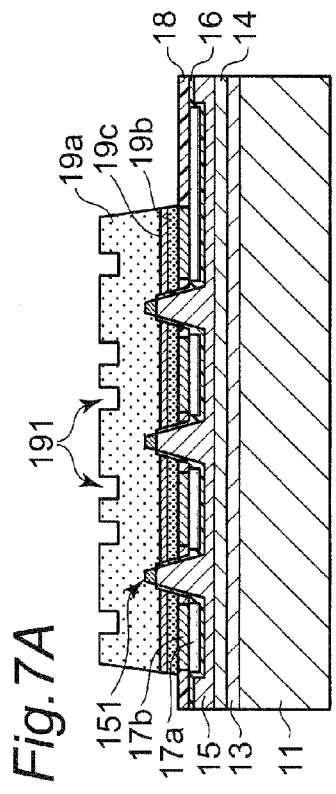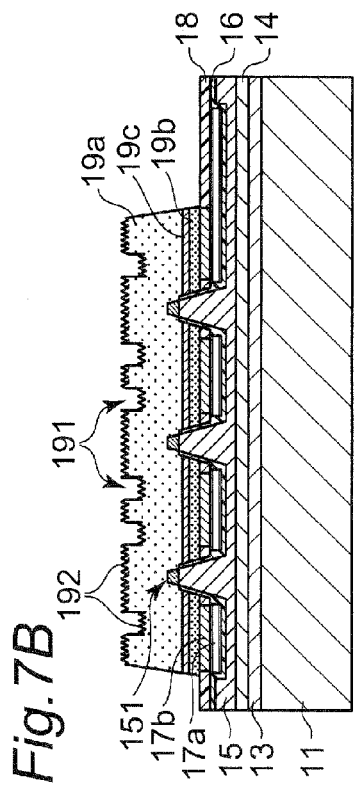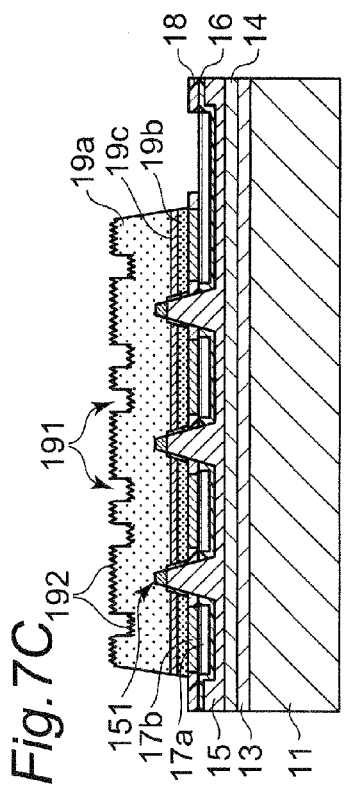

SEMICONDUCTOR LIGHT EMITTING ELEMENT

BACKGROUND OF THE INVENTION

1. Field of the Invention

The present invention relates to a semiconductor light emitting element.

2. Description of the Related Art

Light emitting elements with a plurality of semiconductor layers, such as LEDs, have been proposed, for example, in JP 2011-54967 A, JP 2011-216524 A, and JP 2012-195321 A. For example, JP 2011-54967 A discloses an invention for improving light extraction efficiency by etching the upper face of a first semiconductor layer (first electrically-conductive semiconductor layer) to a predetermined depth so as to form a rough surface.

JP 2011-216524 A discloses an invention for allowing smooth current flow to an n-pad electrode by providing an auxiliary grid electrode that penetrates a second semiconductor layer (p-type layer), an active layer and a first semiconductor layer (n-type layer) so as to connect the auxiliary electrode to the n-pad electrode. JP 2012-195321 A discloses an invention for suppressing repetitive light reflection between the contact face of a first electrode and the upper face of the first semiconductor layer by smoothing the upper portion of the contact face between the first electrode and the first semiconductor layer in the upper face of the first semiconductor layer.

However, there are following disadvantages with the inventions disclosed in JP 2011-54967 A, JP 2011-216524 A, and JP 2012-195321 A. For example, in the invention disclosed in JP 2011-54967 A, the upper face of the first semiconductor layer is partly etched in the area above the contact between the first electrode and the first semiconductor layer, where electric current is likely to be concentrated. Therefore, in the invention disclosed in JP 2011-54967 A, current flow around the contact may be impeded to cause a rise in resistance, which may result in high drive voltage.

In the invention disclosed in JP 2011-216524 A, forming the auxiliary grid electrode decreases an area of the active layer by the amount thereof, which results in decreased light emission and decreased light extraction efficiency. In the invention disclosed in JP 2012-195321 A, because the area above the contact between the first electrode and the first semiconductor layer is flat, light may be reflected more into the laminate structure in this area due to its flat surface, which may result in decreased light extraction efficiency.

SUMMARY OF THE INVENTION

The present invention has been made in view of the above problems, and an object thereof is to provide a semiconductor light emitting element in which the rise in resistance and the decrease in light extraction efficiency are both avoided.

In order to achieve the above object, a semiconductor light emitting element according to one aspect includes:

a semiconductor laminate including a first semiconductor layer, an active layer and a second semiconductor layer which are laminated in descending order from an upper face to a lower face;

a first electrode including a plurality of protrusions that penetrate the second semiconductor layer and the active layer, the first electrode being connected to the first semiconductor layer via the plurality of protrusions;

a second electrode connected to the second semiconductor layer on an lower face of the second semiconductor layer; and an insulation film disposed between the plurality of protrusions and the semiconductor laminate, wherein the plurality of protrusions each include a protrusion body covered with the insulation film and a protrusion tip on the protrusion body, an upper face and a side face of the protrusion tip being exposed from the insulation film, the first semiconductor layer includes a plurality of recesses that are arranged on an upper face of the first semiconductor layer so as to sandwich first areas located above the respective plurality of protrusions, and a distance between the recesses sandwiching the first area is larger than a width of the protrusion tip.

Further, a semiconductor light emitting element according to another aspect includes:

a semiconductor laminate including a first semiconductor layer, a second semiconductor layer and an active layer between the first semiconductor layer and the second semiconductor layer, in which an upper face of the semiconductor laminate includes a surface of the first semiconductor layer, and a lower face of the semiconductor laminate includes a surface of the second semiconductor layer;

a first electrode including a plurality of protrusions that penetrate the second semiconductor layer and the active layer, the first electrode being connected to the first semiconductor layer via the plurality of protrusions;

a second electrode connected to the second semiconductor layer on the lower face; and a plurality of recesses provided in a second area, the second areas being an area on the upper face excluding a plurality of first areas that are located above the respective plurality of protrusions, the plurality of recesses being disposed at an interval narrower than a minimal width of the plurality of first areas.

In the semiconductor light emitting element according to the present invention, the decrease in light extraction efficiency and the rise in resistance are both avoided.

BRIEF DESCRIPTION OF THE DRAWINGS

FIG. 3A is a plan view showing the relationship between protrusions of a first electrode and recesses of the first semiconductor layer, and FIG. 3B is a cross sectional view taken along the line B-B of FIG. 3A.

FIGS. 7A through 7F are schematic views illustrating a part of the manufacturing method of the semiconductor light emitting element according to the first embodiment of the present invention.

FIG. 11A is a plan view showing the relationship between protrusions of a first electrode and recesses of a first semiconductor layer, and FIG. 11B is a cross sectional view taken along the line C-C of FIG. 11A.

DETAILED DESCRIPTION OF THE EMBODIMENTS

Figure 1:
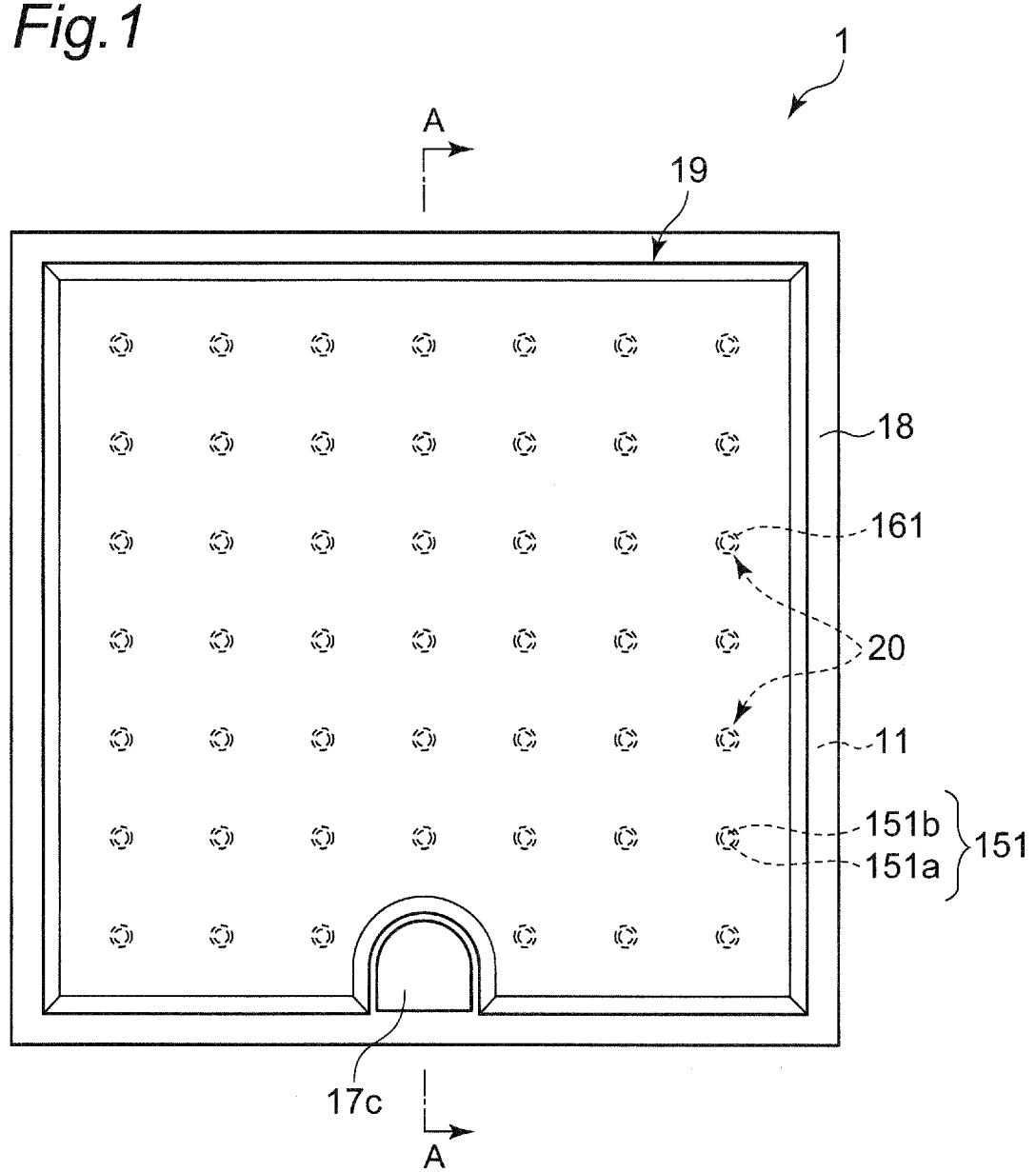
FIG. 1 is a plan view illustrating the overall structure of a semiconductor light emitting element according to a first embodiment of the present invention.

Light emitting elements and the manufacturing method thereof according to embodiments of the present invention will be described below with reference to the accompanying drawings. The drawings referred to in the following description are merely schematic illustrations of the present invention. Therefore, some of them may include exaggerations in terms of scale, interval, positional relationship and the like, or some of the components may not be illustrated in the drawings. Further, in the following description, the same names or reference signs basically refer to the same or similar components, and the detailed description thereof are omitted. Furthermore, a plurality of components of the present invention may be composed of the same single member so that the single member serves as the plurality of components. On the contrary, the function of a certain single component may be performed by cooperation of a plurality of components. Furthermore, some of the features described in examples and embodiments are also applicable to the other examples of embodiments.

First Embodiment

Configuration of Semiconductor Light Emitting Element

The configuration of a semiconductor light emitting element 1 according to a first embodiment of the present invention will be described with reference to FIGS. 1 through 4.

Figure 2:
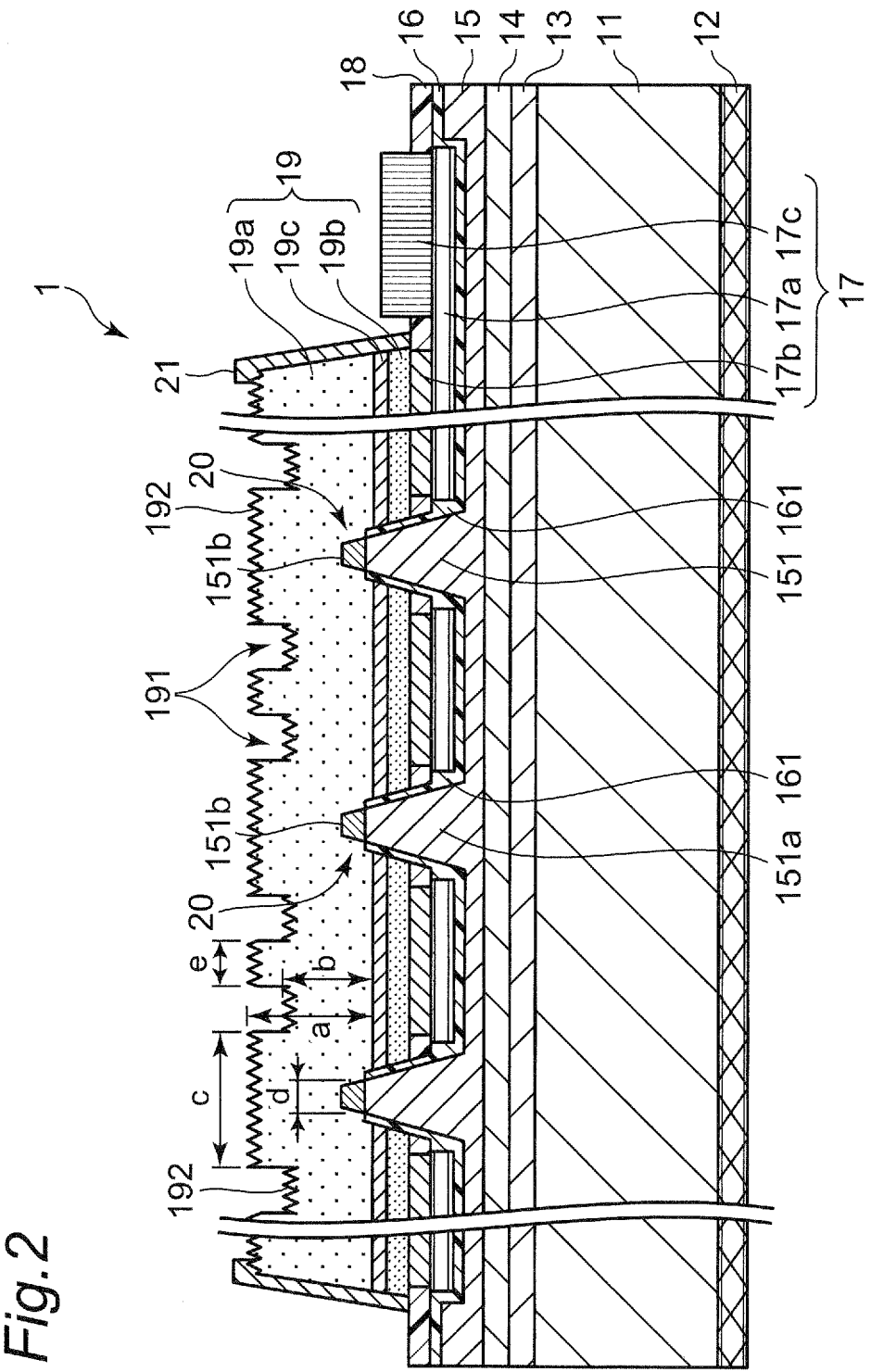
FIG. 2 is a view illustrating the overall structure of the semiconductor light emitting element according to the first embodiment of the present invention, specifically a cross sectional view taken along the line A-A of FIG. 1.

The semiconductor light emitting element 1 is configured in a rectangular shape in a plan view as illustrated in FIG. 1. Further, the semiconductor light emitting element 1 includes an upper portion configured in an approximately trapezoidal cross-sectional shape as illustrated in FIG. 2, which is composed of a semiconductor laminate 19. To be more specific, the semiconductor laminate 19 is configured in the shape of approximately a frustum of rectangular pyramid, and is disposed on a flat plate having a predetermined thickness. In the semiconductor light emitting element 1, the approximately frustum upper portion is partly cut off as illustrated in FIGS. 1 and 2, where an external connector 17c of a second electrode 17 mentioned below is formed. The area (cutout portion) for forming the external connector 17c is, for example, a recess on the outer periphery that is formed by partly removing the semiconductor laminate 19. The outer connector 17c is formed inside the cutout portion.

In this embodiment, as illustrated in FIG. 2, the semiconductor light emitting element 1 includes a substrate 11, and a substrate adhesion layer 13, a first electrode adhesion layer 14, a first electrode 15, an insulation film 16, a second electrode 17, a first protection film 18, a semiconductor laminate 19 and a second protection film 21, which are laminated on the substrate 11. On the lower face of the substrate 11, a back face adhesion layer 12 is provided. While FIG. 2 is a cross sectional view taken along line A-A of FIG. 1, it illustrates only three protrusions 151 of the first electrode 15 located on the side of an external connector 17c of the second electrode 17 among six protrusions 151 that are supposed to appear on the A-A cross section of FIG. 1, and the other three are not illustrated for descriptive reasons.

That is, the semiconductor light emitting element 1 of the first embodiment includes the substrate 11 and the semiconductor laminate 19 above the substrate 11 in which a first semiconductor layer 19a, an active layer 19c and a second semiconductor layer 19b are laminated in descending order from the upper face to the lower face. Further, the semiconductor light emitting element 1 has the following structure.

The first electrode 15 and the second electrode 17 are respectively connected to the first semiconductor layer 19a and the second semiconductor layer 19b, and are both disposed between the semiconductor laminate 19 and the substrate 11.

The first electrode 15 and the second electrode 17 are electrically separated by the insulation film 16 disposed between the first electrode 15 and the second electrode 17. The insulation film 16 also electrically separates the protrusions 151 of the first electrode 15 from the second semiconductor layer 19b and the active layer 19c.

The first electrode 15 includes protrusions 151 for the connection to the first semiconductor layer 19a, and the protrusions 151 each include a protrusion body 151a covered with the insulation film 16 and a protrusion tip 151b that is positioned on the top of the protrusion body 151a and is exposed from the insulation film 16 to be connected to the first semiconductor layer 19a.

Figure 3A:
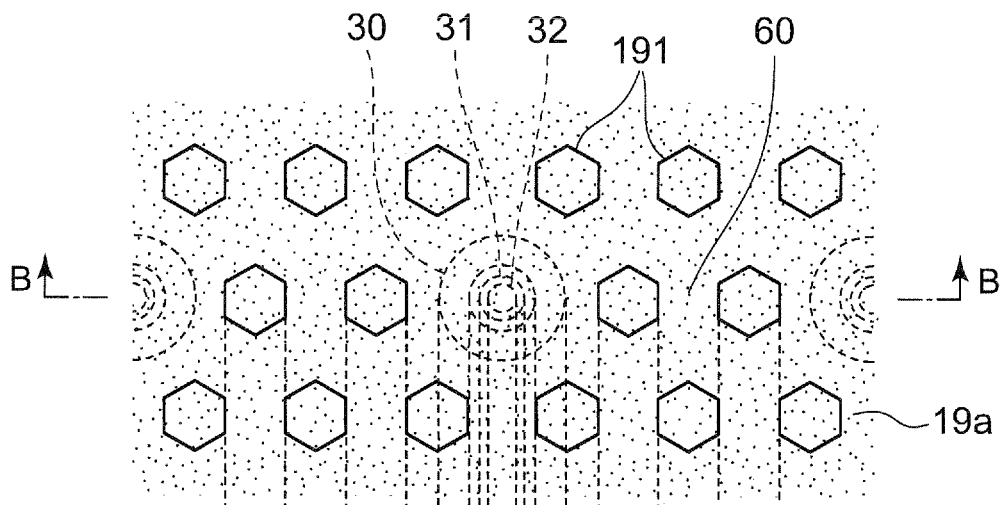
FIGS. 3A and 3B are enlarged views illustrating a part of the semiconductor light emitting element according to the first embodiment of the present invention, where

The semiconductor light emitting element 1 of the first embodiment with the above-described configuration further includes a plurality of recesses 191 on the upper face of the first semiconductor layer 19a in order to efficiently extract the emitted light to the outside. The plurality of recesses 191 are formed on the upper face of the first semiconductor layer 19a except for the areas above the protrusion tips 151b. The term "areas above the protrusion tips 151b" refers to the areas corresponding to the projection images of the protrusion tips 151b on the first semiconductor layer 19a. If the protrusion tips 151 are configured in a cone frustum shape that an area of the bottom face is larger than that of the upper face, it refers to the areas 31 corresponding to the projection images of the bottom faces of the protrusion tips 151b (in other words, the lowermost face of the exposed portions of the protrusions 151 from the insulation film 16). In FIG. 3A, the area above the protrusion 151 is referred to as a first area, and is indicated by reference sign 30. If the protrusions 151 are configured in a cone frustum shape, the areas 31 are included in the first areas 30. The areas 30 above the protrusions 151 refers to the areas corresponding to the projection images of the protrusions 151 on the upper face of the first semiconductor layer. If the protrusions 151 are configured in a cone frustum shape that an area of the bottom face is larger than that of the upper face, it refers to the areas corresponding to the projection images of the bottom faces of the protrusions 151. Further, in FIG. 3A, the area indicated by reference sign 32 is an area that corresponds to the projection image of the upper face (tip face) of the protrusion tip 151b.

As mentioned above, in the semiconductor light emitting element 1 of the first embodiment, the recesses 191 are formed in an area other than the areas above the protrusion tips 151b. In other words, a distance between the recesses positioned across the areas above the protrusion tips 151b is larger than the width of the protrusion tips 151b. In this way, concentration of electric current above of the protrusion 151 is suppressed. That is, if the recesses 191 were formed in the areas above the protrusion tips 151b on the upper face of the first semiconductor layer 19a, the first semiconductor layer 19a would become thin in the areas above the protrusion tips 151b, which would make it difficult for electric current to flow from the protrusions 151 to the first semiconductor layer 19a and further to the whole semiconductor laminate 19. As a result, the resistance of the first semiconductor layer would be likely to increase. However, in the semiconductor light emitting element 1 of the first embodiment, because the plurality of recesses 191 are formed on the upper face of the first semiconductor layer 19a except for the areas above the protrusion tips 151b, the first semiconductor layer 19a does not become thin in the areas above the protrusion tips 151b. Therefore, electric current can be diffused to the first semiconductor layer 19a.

As used herein, the term "width of the protrusion tips 151b" refers to the width of a broadest portion in a sectional view if the protrusion tips 151b are configured in the shape that width varies according to a vertical position in a sectional view such as a cone frustum. That is, the width of the protrusion tips 151b is equal to the width of the areas corresponding to the projection images of the protrusions 151 on the upper face of the first semiconductor layer.

In addition, if a width in the direction of minor axis is different from a width in the major axis in a plane view such as oval or rectangular shape, the term "width of the protrusion tips 151b" refers to the width in the direction of minor axis.

For example, the term "width of the protrusion tips 151b" refers to:

the diameter of the bottom faces of the protrusion tips 151b if the protrusion tips 151b are configured in the shape of a cone frustum that an area of the bottom face is larger than that of the upper face, the minor axis length of the bottom face if the protrusion tips 151b are configured in the shape of a cone frustum having an elliptic cross section in a plan view, the short side length of the bottom faces if the protrusion tips 151b are configured in the shape of a frustum of a pyramid having a rectangular cross section in a plan view, and the side length of the bottom faces if the protrusion tips 151b are configured in the shape of a frustum of a pyramid having a square cross section in a plan view.

In the first embodiment, the distance between adjacent recesses 191 is shorter than the distance between adjacent protrusions 151.

Figure 3B:
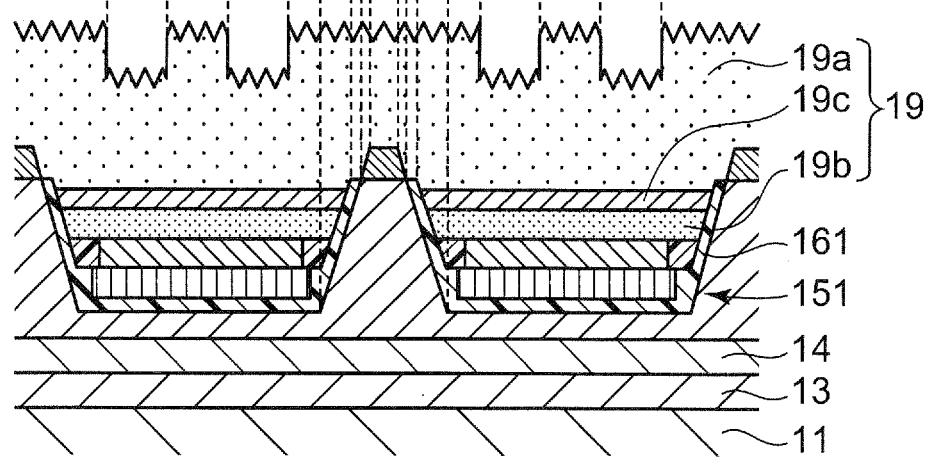

In the above embodiment, the recesses 191 are formed in an area except for the areas above the protrusion tips 151b. However, if the protrusions 151 are configured in a frustum shape as illustrated in FIGS. 3A, 3B and the like, it is preferred that the recesses 191 are formed in an area except for not only the areas above the protrusion tips 151b but also the first areas 30 above the protrusion 151. This can improve electric current diffusion in the vicinity of the protrusion tips 151b, and can thereby suppress electric current concentration to the areas above the protrusions 151 of the first semiconductor layer 19a more effectively. In FIGS. 3A and 3B, the area 30 above the protrusion 151 is referred to as the first area.

Each component of the first semiconductor light emitting element 1 will be described in detail below.

(Substrate 11)

The substrate 11 is bonded to the semiconductor laminate 19 and the like sandwiching electrodes or the like to support the semiconductor laminate 19 and the like. As illustrated in FIGS. 1 and 2, the substrate 11 is configured in an approximately rectangular plate shape, and is disposed below the first electrode 15. Further, as specifically illustrated in FIG. 2, the substrate 11 is provided with the back face adhesion layer 12 and the substrate adhesion layer 13 respectively on its lower and upper faces. The area of the substrate 11 is not particularly limited, and is suitably selected according to the size of the components laminated on the substrate 11. The thickness of the substrate 11 is preferably from 50 μm to 500 μm in terms of heat dissipation.

Examples of the substrate 11 include Si substrates as well as semiconductor substrates made of GaAs or the like and conductive substrates made of metal material such as Cu, Ge and Ni or composite material such as Cu—W. For the substrate 11, Si substrates are advantageous in terms of low price and ease of processing into a chip form. Meanwhile, conductive substrates are advantageous because such substrates enable electric power supply from the substrate 11 and impart good heat dissipation property to the element.

In addition to the above materials, the substrate 11 may also be made of a composite of ceramics and metal such as Cu—Mo, AlSiC, AlSi, AlN, SiC and Cu-diamond. Such composites can be represented by general formulae. For example, Cu—W and Cu—Mo can be represented by $Cu_xW_{100-x}$ ($0 \leq x \leq 30$) and $Cu_xMo_{100-x}$ ($0 \leq x \leq 50$) respectively. It is preferred that the substrate 11 is made of, for example, Si, Cu (Cu—W) or the like, and an electrode or a light reflection structure is interposed between the substrate 11 and the semiconductor laminate 19. This can improve the heat dissipation or light emission properties of the semiconductor light emitting element 1.

(Back Face Adhesion Layer 12)

The back face adhesion layer 12 is electrically connected to the substrate 11, and serves as a layer for mounting the semiconductor light emitting element 1 on, for example, a mount board of a light emitting device (not shown). As illustrated in FIG. 2, the back face adhesion layer 12 is formed on the whole lower face of the substrate 11, i.e. on the side of the substrate 11 opposite the substrate adhesion layer 13. The thickness of the back face adhesion layer 12 is not particularly limited, and may be suitably adjusted according to desired adhesiveness and conductivity. Examples of the back face adhesion layer 12 include layers containing a metal such as $TiSi_2$, Ti, Ni, Pt, Ru, Au, Sn, Al, Co and Mo and laminates of such layers. The back face adhesion layer 12 may be made of the same material as the substrate adhesion layer 13 or first electrode adhesion layer 14, which are mentioned below. For example, it may be made of conductive resin material.

(Substrate Adhesion Layer 13)

The substrate adhesion layer 13 bonds the substrate 11 to the first electrode adhesion layer 14, and electrically connects the substrate 11 to the first electrode adhesion layer 14. As illustrated in FIG. 2, the substrate adhesion layer 13 is formed on the whole upper face of the substrate 11, i.e. on the side of the substrate 11 opposite the back face adhesion layer 12, and is electrically connected to the substrate 11. The thickness of the substrate adhesion layer 13 is not particularly limited, and may be suitably adjusted according to desired adhesiveness and conductivity. Examples of the substrate adhesion layer 13 include layers containing a metal such as Al, Al alloys, $TiSi_2$, Si, Ti, Ni, Pt, Au, Sn, Pd, Rh, Ru, In, Co and Mo and laminates of such layers.

It is preferred that the substrate adhesion layer 13 includes a contact layer, a barrier layer and a bonding layer. This allows the substrate adhesion layer 13 to serve as both bonding member and electric power supply like the first electrode 15. If the substrate adhesion layer 13 is a metal laminate as mentioned above, it is preferred that the topmost face thereof is made of Au to form an Au—Au bonding with the first electrode adhesion layer 14. For example, it may be a laminate such as $TiSi_2$/Pt/AuSn, $TiSi_2$/Pt/Au, Ti/Pt/Au, Ti/Ru/Au or Co/Mo/Au in ascending order from the side of the substrate 11. If the outer surfaces of the substrate adhesion layer 13 and the first electrode adhesion layer 14 are both made of Au to form an Au—Au bonding at the interface, it can improve the thermal resistance, and thereby can improve the reliability of the semiconductor light emitting element 1.

(First Electrode Adhesion Layer 14)

The first electrode adhesion layer 14 bonds the first electrode 15 to the substrate adhesion layer 13, and electrically connects the substrate adhesion layer 13 to the semiconductor laminate 19. As illustrated in FIG. 2, the first electrode adhesion layer 14 is formed on the whole lower face of the first electrode 15. The thickness of the first electrode adhesion layer 14 is not particularly limited, and may be suitably adjusted according to desired adhesiveness and conductivity. As with the above substrate adhesion layer 13, examples of the first electrode adhesion layer 14 include layers containing a metal such as Al, Al alloys, $TiSi_2$, Si, Ni, Ti, Pt, Au, Sn, Pd, Rh, Ru, In, Co and Mo and laminates thereof.

As with the above substrate adhesion layer 13, it is preferred that the first electrode adhesion layer 14 includes a contact layer, a barrier layer and a bonding layer. This allows the first electrode adhesion layer 14 to serve as both bonding member and electric power supply like the first electrode 15. If the first electrode adhesion layer 14 is a metal laminate as mentioned above, it is preferred that the lowermost face thereof is made of Au to form Au—Au bonding to the substrate adhesion layer 13. For example, it may be a laminate such as $TiSi_2$/Pt/AuSn, $TiSi_2$/Pt/Au, Ti/Pt/Au, Ti/Ru/Au, Ti/Mo/Au or Co/Mo/Au in ascending order from the side of the first electrode 15. Further, if the outer surfaces of the first electrode adhesion layer 14 and the substrate adhesion layer 13 are both made of Au to form an Au—Au bonding at the interface, it can improve the thermal resistance and thereby improve the reliability of the semiconductor light emitting element 1.

(First Electrode 15)

The first electrode 15 supplies the first semiconductor layer 19a with electric current. In the first embodiment where the first semiconductor layer 19a is an n-type semiconductor layer, the first electrode 15 serves as an n-electrode. As illustrated in FIG. 2, the first electrode 15 is formed on the whole upper face of the first electrode adhesion layer 14, and is opposed to the second electrode 17 across the insulation film 16 mentioned below. Further, as illustrated in FIG. 2, the first electrode 15 is formed on a larger area than the area of the semiconductor laminate 19 mentioned below. As used herein, the term "the area of the semiconductor laminate 19" means the area of the lower face of the semiconductor laminate 19 (i.e. the lower face of the second semiconductor layer 19b) as illustrated in FIG. 1.

As illustrated in FIG. 2, the first electrode 15 includes the plurality of protrusions 151 that project in the lamination direction of the semiconductor laminate 19 (upward in the figure), and is electrically connected to the first semiconductor layer 19a via the protrusions 151. As illustrated in FIGS. 1 and 2, the protrusions 151 include protrusion bodies 151a that project from the flat part of the first electrode 15 (the part other than the protrusions 151, reference symbols are omitted) and the protrusion tips 151b provided on the tips of the protrusion bodies 151a. In more detail, the protrusions 151 include the protrusion bodies 151a covered with the insulation film 16 mentioned below and the protrusion tips 151b that are provided on the protrusion bodies 151a and are exposed from the insulation film 16. As illustrated in FIG. 2, the protrusion tips 151b are indirect contact with the first semiconductor layer 19a, and the upper and side faces thereof are preferably exposed from the insulation film 16. Further, the protrusion tips 151 are preferably made of, for example, a highly reflective material or a material that can make good contact.

Because the upper and side faces of the protrusion tips 151b are exposed from the insulation film 16 as mentioned above, a large contact area is ensured between the protrusion tips 151b and the first semiconductor layer 19a, which can reduce the contact resistance between the protrusion tips 151b and the first semiconductor layer 19a. Furthermore, because the upper and side faces of the protrusion tips 151b are exposed from the insulation film 16, the protrusion tips 151b effectively reflect light, which can suppress the decrease in light extraction efficiency.

The protrusions 151 are configured in an exact circular shape in a plan view as illustrated in FIG. 1. Further, the protrusions 151 are configured in approximately a trapezoidal cross-sectional shape as illustrated in FIG. 2. To be more specific, the protrusions 151 are configured in approximately a cone frustum shape, i.e. approximately a truncated cone shape. As illustrated in FIG. 1, there are 48 protrusions 151 configured in this shape under the semiconductor laminate 19 mentioned below. Accordingly, the first electrode 15 is connected to the semiconductor layer 19 at 48 spots.

In this embodiment, the protrusions 151 are arranged in columns and rows in a plan view as illustrated in FIG. 1. That is, in a plan view of the semiconductor light emitting element 1, the protrusions 151 are arranged at regular intervals in both length and width directions to form a matrix. Because the first electrode 15 is connected to the first semiconductor layer 19a at the plurality of protrusions 151, the semiconductor light emitting element 1 can have a large light emitting area. Furthermore, because the plurality of protrusions 151 are dispersed and regularly arranged in columns and rows, electric current is likely to be evenly distributed over the semiconductor laminate 19 in the semiconductor light emitting element 1.

If the protrusions 151 are configured in a cone frustum shape, the diameter of the bottom faces of the protrusions 151 is set, for example, in the range from 35 μm to 100 μm. If the protrusion tips 151b are configured in a cone frustum shape, the diameter of the bottom faces of the protrusion tips 151b is set, for example, in the range from 30 μm to 70 μm. Further, the protrusions 151 are preferably configured such that the sum of the bottom face areas of the protrusion tips 151b (in other words, the lowermost face areas of the exposed portions of the protrusions 151 from the insulation film 16) ranges from 0.8% to 5.0% of the area of the upper face of the first semiconductor layer 19a. This can minimize the non-light emitting area of the semiconductor light emitting element 1, which results in improved luminous efficacy.

As illustrated in FIG. 2, the protrusions 151 project penetrating the insulation film 16, first protection film 18, second electrode 17, second semiconductor layer 19*b* and active layer 19*c*, which are mentioned below, and are in contact with the first semiconductor layer 19*a* at their tips, i.e. the protrusion tips 151*b*. To be more specific, as illustrated in FIG. 2, the protrusions 151 are inserted in projected openings 161 of the insulation film 16, and are connected to the first semiconductor layer 19*a* via through holes 20 and projected openings 161. The projected openings 161 are formed inside the through holes 20 that penetrate the first protection film 18, second semiconductor layer 19*b* and active layer 19*c*.

The thickness of the first electrode 15 is not particularly limited, and may be suitably adjusted according to desired properties. As used herein, the thickness of the first electrode 15 means the sum of the film thickness of the flat part (reference symbols are omitted) of the first electrode 15 and the height of the protrusions 151. The first electrodes 15 may be made of, for example, metal such as Ni, Pt, Pd, Rh, Ru, Os, Ir, Ti, Zr, Hf, V, Nb, Ta, Co, Fe, Mn, Mo, Cr, W, La, Cu, Ag, Y, Al, Si, Au, Zn and Sn, or the oxide or nitride thereof. In addition, it may also be made of monolayer or laminated film of a metal or an alloy including at least one transparent conductive oxide selected from the group consisting of ITO, ZnO and $In_2O_3$ and the like.

As illustrated in FIG. 2, the first electrode 15 is in contact with the first semiconductor layer 19*a* at the protrusion tips 151*b*, and is insulated from the semiconductor laminate 19 in the through holes 20 by the insulation film 16. It is preferred that the protrusion tips 151*b* are made of a material that is capable of making ohmic contact with the first semiconductor layer 19*a* and also reflects the light emerging from the active layer 19*c*. In particular, they preferably contain at least one of Ag, Al and Ti. Specifically, the protrusion tips 151*b* are preferably made of Al or an Al alloy. The protrusion tips 151*b* may be made of the same material as the protrusion bodies 151*a* or may be made of a different material from the protrusion bodies 151*a*. Also, the protrusion bodies 151*a* of the protrusions 151 may be made of the same material as the flat part (reference symbols are omitted) of the first electrode 15.

(Insulation Film 16)

The insulation film 16 provides insulation between the first electrode 15, the second electrode 17 and insulation between the first electrode 15 and the second semiconductor layer 19*b* and active layer 19*c*. As illustrated in FIG. 2, the insulation film 16 is formed covering the whole surface of the first electrode 15 except for the protrusion tips 151*b*. Further, the insulation film 16 is also formed between the first electrode 15 and the lead 17*a* of the second electrode 17 mentioned below.

As illustrated in FIG. 2, the insulation film 16 includes the plurality of projected openings 161 that project in the lamination direction of the semiconductor laminate 19 (upward in the figures) and are open at the tips. The projected openings 161 cover the circumferential faces of the protrusions 151 (specifically, the protrusion bodies 151*a*) of the first electrode 15.

In a plan view as illustrated in FIG. 1, the projected openings 161 are configured in an exactly circular shape. In a cross sectional view as illustrated in FIG. 2, the projected openings 161 are configured in a tubular shape. To be more specific, the projected openings 161 are configured in approximately a hollow cone frustum shape, i.e. hollow truncated cone shape. As illustrated in FIG. 1, there are 48 projected openings 161 having the above shape below the semiconductor laminate 19.

As illustrated in FIG. 2, the projected openings 161 are formed penetrating the second electrode 17, the first protection film 18, the second semiconductor layer 19*b* and the active layer 19*c*, which are mentioned below, and are in contact with the first semiconductor layer 19*a* at the tips of the openings. To be more specific, the projected openings 161 are provided on the inner walls of the through holes 20 that penetrate the second electrode 17, the first protection film 18, the second semiconductor layer 19*b* and the active layer 19*c*. In the semiconductor light emitting element 1, the insulation film 16 provides insulation between the first electrode 15 and the second electrode 17, and thereby allows for the three-dimensional structure of the electrodes.

The thickness of the insulation film 16 is not particularly limited, and may be suitably adjusted according to desired properties. As used herein, the thickness of the insulation film 16 means the sum of the film thickness of the flat part (reference symbols are omitted) of the insulation film 16 and the height of the projected openings 161. The insulation film 16 may be made of, for example, an oxide film, nitride film or oxynitride film including at least one element selected from the group consisting of Si, Ti, V, Zr, Nb, Hf, Ta, Al and B. In particular, it may be made of $SiO_2$, $ZrO_2$, SiN, SiON, BN, SiC, SiOC, $Al_2O_2$, AlN, AlGaN, $Nb_2O_5$ or the like. The insulation film 16 may be a monolayer or laminate film of a single material or a laminate film of different materials. Alternatively, the insulation film 16 may also be made of a distributed Bragg reflector (DBR) film.

(Second Electrode 17)

The second electrode 17 supplies the second semiconductor layer 19*b* with electric current. In the first embodiment where the second semiconductor layer 19*b* is a p-type semiconductor layer, the second electrode 17 serves as a p-electrode. As illustrated in FIG. 2, the second electrode 17 is formed in a film shape below the second semiconductor layer 19*b*, and is opposed to the first electrode 15 across the insulation film 16. To be more specific, the second electrode 17 includes an internal connector 17*b* connected to the second semiconductor layer 19*b*, a lead 17*a* electrically connected to the second semiconductor layer 19*b* via the internal connector 17*b*, and an external connectors 17*c* connected to the lead 17*a*.

The lead 17*a* supplies the second semiconductor layer 19*b* of the semiconductor laminate 19 mentioned below with electric current from the external connectors 17*c* via the internal connectors 17*b*. As illustrated in FIG. 2, lead 17*a* is formed on the area corresponding to almost whole lower face of the second semiconductor layer 19*b* except for the areas of the projected openings 161 of the insulation film 16. Further, the lead 17*a* extends out beyond the area corresponding to the whole lower face of the second semiconductor layer 19*b* to be exposed on the bottom face of the cutout of the semiconductor laminate 19. On this exposed lead 17*a*, the external connector 17*c* mentioned below is provided.

Although not shown in the figure, the lead 17*a* is specifically made of a plate or a layer having approximately the same area as the bottom area of the semiconductor laminate 19. As illustrated in FIG. 2, the lead 17*a* has a plurality of openings (reference symbols are omitted) that are formed concentrically with the projected openings 161 of the insulation film 16, where the projected openings 161 are disposed. As with the internal connector 17*b* mentioned below, the lead 17*a* is preferably made of a material that has high reflectivity to light from the active layer 19*c* and high conductivity.

The internal connector 17*b* is preferably made of a material that makes good ohmic contact with the semiconductor laminate 19 and effectively reflects the light from the active layer

19c. If the internal connector 17b is made of a transparent material such as transparent conductive oxides, a layer made of a highly reflective material such as DBR film or Al may be provided on the lower side (the side of the substrate 11) of the internal connector 17b. As illustrated in FIG. 2, the internal connector 17b is formed on almost the whole lower face of the second semiconductor layer 19b except for the areas of the protrusions 151 of the first electrode 15 and the area of the first protection film 18. On the lower face of the internal connector 17b, the lead 17a is formed.

It is preferred that the internal connector 17b has an area of 70% or more, more preferably 80% or more, yet more preferably 90% or more of the lower face area of the second semiconductor layer 19b. This can reduce the contact resistance between the internal connector 17b and the second semiconductor layer 19b in the semiconductor light emitting element 1. Furthermore, with the internal connectors 17b having an area of 70% or more of the area of the second semiconductor layer 19b, the light from the active layer 19c can be reflected at almost the whole area of the second semiconductor layer 19b, which can improve the light extraction efficiency.

Specifically, although not shown in the figure, the internal connector 17b is made of a plate or a layer having approximately the same area as the bottom area of the semiconductor laminate 19. As illustrated in FIG. 2, the internal connector 17b has a plurality of openings (reference symbols are omitted) that are formed concentrically with the projected openings 161 of the insulation film 16, where the projected openings 161 are provided sandwiching the first protection film 18 mentioned below.

As a reflector for the light from the semiconductor laminate 19, the internal connector 17b is preferably made of a monolayer or laminate film of a metal or an alloy containing at least one selected from Al, Rh and Ag, of which a metal film containing Ag or an Ag alloy is preferred. For example, if the internal connector 17b is made of a laminate film, it may be a laminate of Pt/Ti/Ni/Ag in ascending order from the side of the substrate 11 so that the material on the side of the semiconductor laminate 19 is Ag. Further, a DBR film may be provided on the lower side (the side of the substrate 11) of the internal connector 17b. In order to prevent migration, the internal connectors 17b may be provided with another metal-containing layer that serves as a cover electrode by completely covering the side faces and the lower face (the side of the substrate 11) thereof. Further, in the semiconductor light emitting element 1, the lead 17a is placed under the internal connector 17b, and the first protection film 18 covers the side faces of the internal connector 17b as illustrated in FIG. 2. Therefore, they also serve as means for preventing migration.

The external connector 17c serves as an electrode pad of the second electrode 17 to be connected to an external power source. As illustrated in FIG. 2, the external connector 17c is exposed from the first protection film 18 above the substrate 11. To be more specific, the external connector 17c is provided on the lead 17a, and penetrates the first protection film 18. As illustrated in FIG. 1, the external connector 17c is configured in an approximately half-round shape, and as illustrated in FIG. 2, is surrounded by the first protection film 18 and has a predetermined height. Although not shown in the figures, the external connector 17c includes a bump on the upper face thereof for the connection to an external power source using a conductive wire or the like.

It is preferred that the external connector 17c is provided at a position other than the corners of the semiconductor light emitting element 1. In this embodiment, it is placed on a part of the outer circumference except for the corners of the semiconductor light emitting element 1 as illustrated in FIGS. 1 and 2. It is also preferred that two or more external connectors 17c are placed sandwiching the semiconductor laminate 19 on the outer circumference of the semiconductor light emitting element 1, for example, on the opposite sides. If n pieces of external connectors 17c are provided, it is preferred that the n pieces of external connectors 17c are placed n-fold symmetrically on the outer circumference of the semiconductor light emitting element 1. For example, two external connectors 17c are provided, it is preferred that they are placed symmetrically about the center point of the semiconductor light emitting element 1 at opposite positions across the semiconductor laminate 19. Such arrangements of the external connector 17c enable uniformly injecting electric current to the semiconductor laminate 19.

As illustrated in FIG. 1, the external connector 17c is exposed at least at an end (a part of the outer circumference) above the substrate 11. By placing the external connector 17c on the outer circumference, a conductive wire (not shown) to be connected to the external connector 17c can be positioned not to interfere with the light above the semiconductor laminate 19 as far as possible. This can reduce the light absorption by the conductive wire, which results in improved light output. Because the conductive wire for external connection interferes with the light emission, it is preferred that the external connector 17c is placed on the rim of the semiconductor light emitting element 1 as illustrated in FIG. 1. However, it may also be placed, for example, in the center of the semiconductor light emitting element 1. The size, shape, number and position of the external connector 17c are not particularly limited, and may be suitably adjusted according to the size of the semiconductor light emitting element 1 and the size and shape of the semiconductor laminate 19.

The thickness of the second electrode 17 (the lead 17a, the internal connector 17b and the external connector 17c) is not particularly limited, and may be suitably adjusted according to desired properties. The lead 17a and external connectors 17c may be made of, for example, metal such as Ni, Pt, Pd, Rh, Ru, Os, Ir, Ti, Zr, Hf, V, Nb, Ta, Co, Fe, Mn, Mo, Cr, W, La, Cu, Ag, Y, Al, Si and Au, or an oxide or nitride thereof. In addition, it may also be made of a monolayer or a laminated film of a metal or an alloy including at least one transparent conductive oxide selected from the group consisting of ITO, ZnO and $In_2O_3$ and the like.

(First Protection Film (Light Reflector) 18)

As illustrated in FIG. 2, the first protection film 18 is placed in the same layer as the internal connectors 17b. That is, the first protection film 18 fills the gap between the internal connector 17b and the external connector 17c and the gap between the internal connectors 17b and the projected openings 161 of the insulation film 16. Further, as illustrated in FIG. 2, the first protection film 18 is formed covering the exposed part of the upper face of the insulation film 16 that extends out beyond the semiconductor laminate 19. Further, as illustrated in FIG. 2, the first protection film 18 is provided between the lead 17a and the second protection film 21, between the lead 17a and the second semiconductor layer 19b, between the insulation film 16 and the second semiconductor layer 19b and between the insulation film 16 and the second protection film 21.

In this embodiment, the first protection film 18 may serve as a light reflector to reflect a part of the light emitted from the active layer 19c, and may be made of, for example, a white resin containing a light diffuser such as $TiO_2$ or a distributed Bragg reflector film to impart this function. Further, the first protection film 18 as a light reflector may be made of an insulation film of $SiO_2$ or the like, so as to reflect light on the interface between the insulation film and the above other components. The thickness of the first protection film 18 is not particularly limited, and may be suitably adjusted according to desired properties.

(Semiconductor Laminate 19)

The semiconductor laminate 19 serves as a light emitting member of the semiconductor light emitting element 1. As illustrated in FIG. 2, the semiconductor laminate 19 is placed above the substrate 11. Between the semiconductor laminate 19 and the substrate 11, the substrate adhesion layer 13, the first electrode adhesion layer 14, the first electrode 15, the insulation film 16, the second electrode 17 and the first protection film 18 are placed. Specifically, as illustrated in FIG. 2, the semiconductor laminate 19 is formed on the internal connector 17b of the second electrode 17 and the first protection film 18, and is poked by the protrusions 151 of the first electrode 15 and the projected openings 161 of the insulation film 16 at a plurality of spots. As used herein, the term "being poked" means that the protrusions 151 and the projected openings 161 thoroughly penetrate the second semiconductor layer 19b and the active layer 19c of the semiconductor laminate 19 and further penetrate the lower face of the first semiconductor layer 19a of the semiconductor laminate 19 to reach the middle thereof in the thickness direction as illustrated in FIG. 2.

As illustrated in FIG. 2, the semiconductor laminate 19 includes the first semiconductor layer 19a, the active layer 19c and the second semiconductor layer 19b, which are laminated in descending order. The configurations of the first semiconductor layer 19a, the second semiconductor layer 19b and the active layer 19c are not specifically limited, and may be made of an InAlGaP, InP or AlGaAs material or a mixed crystal thereof or a nitride semiconductor such as GaN. Such nitride semiconductors include III-V nitride semiconductors ($In_XAl_YGa_{1-X-Y}N$ ($0 \leq X$, $0 \leq Y$, $X+Y \leq 1$)) such as GaN, AlN, InN and the mixed crystals thereof. Further, the group III element may be partially or completely substituted with B, and element N of the group V element may be in the form of a mixed crystal where the element N is partially substituted with P, As or Sb. In general, these semiconductor layers are doped with an n-type or p-type impurity.

The first semiconductor layer 19a represents one of n-type and p-type semiconductor layers, and the second semiconductor layer 19b represents a semiconductor layer of a different type from the first semiconductor layer 19a, i.e. the other of n-type and p-type semiconductor layers. In this embodiment, as a preferred embodiment of the semiconductor light emitting element 1, the first semiconductor layer 19a is an n-type semiconductor layer, and the second semiconductor layer 19b is a p-type semiconductor layer. In this embodiment having this configuration, it is preferred that the resistance in the first semiconductor layer 19a is lower than the resistance in the second semiconductor layer 19b. This improves electric current diffusion in the first semiconductor layer 19a that is connected to the first electrode 15, and thereby can further suppress electric current concentration which is likely to occur around the first electrode 15. If the first semiconductor layer 19a is an n-type semiconductor layer, the thickness of the first semiconductor layer 19a is set in the range from 1 μm to 20 μm, preferably in the range from 2 μm to 15 μm. Meanwhile, the thickness of the second semiconductor layer 19b, which is a p-type semiconductor layer in this case, is set in the range from 10 nm to 5 μm, preferably in the range from 50 nm to 1 μm.

The first semiconductor layer 19a and the second semiconductor layer 19b of the semiconductor laminate 19 may be each made of a monolayer or a plurality of layers. Further, they may have a laminate structure such as homo-, hetero- and doublehetero-structure with an MIS, PIN or PN junction. As illustrated in FIG. 2, the semiconductor light emitting element 1 may include the active layer 19c between the first semiconductor layer 19a (n-type semiconductor layer) and the second semiconductor layer 19b (p-type semiconductor layer) to allow the active layer 19c to serve as a light emitting part. Alternatively, the first semiconductor layer 19a (n-type semiconductor layer) and the second semiconductor layer 19b (p-type semiconductor layer) may be in direct contact with each other to serve as a light emitting part. The thicknesses of the first semiconductor layer 19a, second semiconductor layer 19b and active layer 19c of the semiconductor laminate 19 are not particularly limited, and may be suitably adjusted according to desired properties.

As illustrated in FIG. 2, the side faces of the semiconductor laminate 19 are inclined in a tapered shape. That is, the side faces of each of the semiconductor laminate 19 are inclined in a forward-tapered shape. Therefore, in the semiconductor light emitting element 1, the light emerging from the active layer 19c can be readily emitted from the tapered side faces of the semiconductor laminate 19, which results in improved light extraction efficiency.

On the upper face of the semiconductor laminate 19, a plurality of recesses 191 are formed as illustrated in FIG. 2. The plurality of recesses 191 are formed to a predetermined depth on the upper face of the first semiconductor layer 19a except for the areas corresponding to the upper portions of the protrusions 151. The areas corresponding to the upper portions of the protrusions 151 refer to areas that correspond to the parallel-projection images of the protrusion tips 151b on the upper face of the first semiconductor layer 19a. If the protrusion tips 151b are configured in a cone frustum shape, they are areas corresponding to the projection images of the bottom faces of the protrusion tips 151b. That is, in this embodiment, the recesses 191 are provided on the upper face of the first semiconductor layer 19a except for the areas corresponding to the upper portions of the protrusions 151, and the distance c between two recesses 191 across an area corresponding to the upper portion of a protrusion 151 is wider than the width of the protrusion tips 151b. If the protrusion tips 151b are configured in a cone frustum shape, it is preferred that the distance c between two recesses 191 across an area corresponding to the upper portion of a protrusion 151 is wider than the width d of the bottom faces of the protrusion tips 151b. As used herein, the distance c between the recesses 191 refers to the distance from the upper end of a side face of a recess 191 to the upper end of a side face of another recess 191.

As mentioned above, in the semiconductor light emitting element 1, because the recesses 191 are formed on the upper face of the first semiconductor layer 19a avoiding the areas corresponding to the upper portions of the protrusions 151, the thickness a of the first semiconductor layer 19a around the protrusions 151 is thicker than the thickness b of the first semiconductor layer 19a in the areas where recesses 191 are formed, which allows electric current to readily diffuse in the upper and lateral directions in the first semiconductor layer 19a around the protrusions 151. This can suppress the rise in resistance in the first semiconductor layer 19a around the protrusions 151, and can therefore suppress the rise in drive voltage. Even if electric current around the protrusions 151 in the first semiconductor layer 19a is diffused in the lateral direction, the electric current density around the protrusions 151 still tends to be high. Accordingly, the active layer exhibits stronger luminous intensity near the protrusions 151. However, in this embodiment, the light emitted from the vicinity of the protrusions 151 in the active layer can be effectively extracted to the outside from the recesses 191 that are formed surrounding the areas corresponding to the upper portions of the protrusions 151. Therefore, in the semiconductor light emitting element 1 of this embodiment, the rise in resistance and the decrease in light extraction efficiency are both avoided.

Further, as illustrated in FIGS. 3A and 3B, it is preferred that the recesses 191 are formed around the areas corresponding to the projection images of the protrusions 151 on the first semiconductor layer 19a avoiding these areas. Further, as illustrated FIG. 3A, a plurality of recesses 191 (two recesses in this embodiment) are formed in each area between two adjacent protrusions 151. To be more specific, the term "area between adjacent two protrusions 151" refers to the area on a virtual line connecting two adjacent protrusions 151 as illustrated in FIG. 3A. Although not shown in the figures, the plurality of recesses 191 are formed not only along the rows and columns of the protrusions 151 as illustrated in FIG. 3A but also along oblique lines. As mentioned above, by providing the plurality of recesses 191 on the upper face of the first semiconductor layer 19a, the light emitted from the active layer 19c can be diffused on the upper face of the first semiconductor light emitting layer 19a, which results in improved light extraction efficiency of the semiconductor light emitting element 1. Although not shown in FIG. 1, the recesses 191 are formed on the whole upper face of the first semiconductor layer 19a. It is preferred that the total area of the plurality of recesses 191 ranges from 40% to 50% of the area of the upper face (the whole upper face including the bottom faces of the recesses 191) of the first semiconductor layer 19a.

Figure 4:
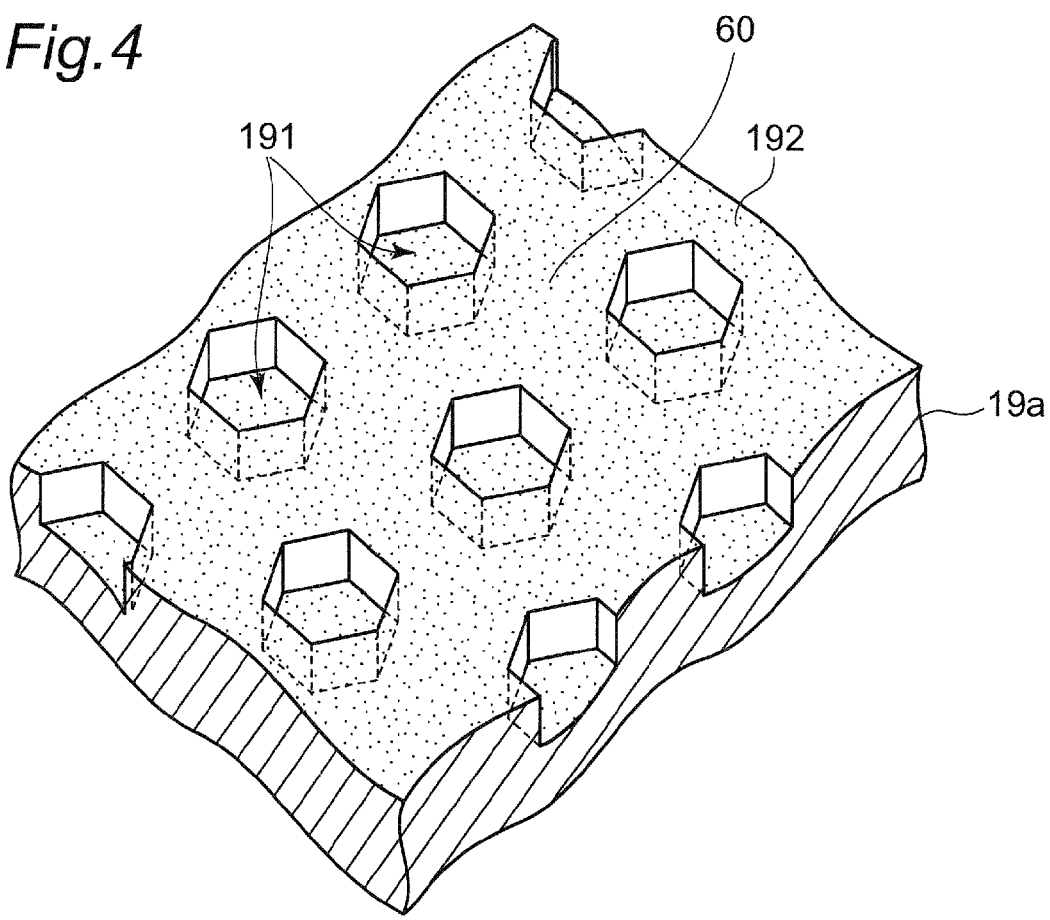
FIG. 4 is an enlarged perspective view illustrating some of the recesses on the first semiconductor layer of the semiconductor light emitting element according to the first embodiment of the present invention.

Specifically, the recesses 191 are configured in approximately a hexagon shape as illustrated in FIG. 4, where hexagonal columns are removed from the upper face of the first semiconductor layer 19a. The number of the recesses 191 is not specifically limited, and may be suitably adjusted according to desired properties.

On the upper face of the first semiconductor layer 19a including the bottom faces of the recesses 191, rough surfaces 192 are formed as illustrated in FIG. 2. The texture (projections and depressions) of the rough surfaces 192 has a random pattern, and has a height difference shorter than the depth of the recesses 191 and a pitch narrower than the pitch of the recesses 191. That is, the texture of the rough surface 192 is finer than the recesses 191. As mentioned above, because the rough surface 192 are formed on the whole upper face of the first semiconductor layer 19a including the bottom faces of the recesses 191, the light can be diffused on the whole upper face of the first semiconductor layer 19a in the semiconductor light emitting element 1.

It is preferred that the area of the bottom face of one of the recesses 191 is smaller than the area of the bottom face of one of the protrusion tips 151b. In the semiconductor light emitting element 1, this can ensure that the first semiconductor layer 19a is sufficiently thick around the protrusions 151 where electric current is likely to be concentrated, which can suppress the rise in resistance of the first semiconductor layer 19a. While there are a plurality of recesses 191 between the protrusions 151, the thick portion (the portion having thickness a in FIG. 2) of the first semiconductor layer 19a is continuous as illustrated in FIG. 4. Therefore, electric current can be diffused over the semiconductor laminate 19.

In the recesses 191 formed on the upper face of the first semiconductor layer 19a, it is preferred that the distance e between adjacent recesses 191 that are located in the area between the protrusions 151 is shorter than the width d of the protrusions 151.

The above distance c between the recesses 191, the bottom face width d of the protrusion tips 151b and the distance e between the recesses 191 depend on the size of the semiconductor light emitting element 1, and for example, may be within the ranges of c=80 to 150 µm, d=30 to 70 µm, and e=1 to 50 µm respectively.

(Through Hole 20)

As illustrated in FIGS. 1 and 2, the semiconductor laminate 19 has the plurality of through holes 20. The through holes 20 are formed by removing the second semiconductor layer 19b, the active layer 19c and part of the first semiconductor layer 19a. Specifically, the through holes 20 penetrate the second semiconductor layer 19b and the active layer 19c in a round shape. In the through holes 20, the projected openings 161 of the insulation film 16 and the protrusions 151 of the first electrode 15 are provided.

As illustrated in FIGS. 1 and 2, the through holes 20 are each configured in approximately a cone frustum shape corresponding to the outer shape of the projected openings 161. Further, in a plan view as illustrated in FIG. 1, the through holes have an exactly circular cross-sectional shape (cross-sectional shape on a cross section parallel to the substrate 11), and there are 48 through holes 20 in the semiconductor laminate 19. In the semiconductor light emitting element 1, this exactly round shape of the through holes 20 can minimize the part of the semiconductor laminate 19 that does not contribute to the light emission.

(Second Protection Film 21)

The second protection film 21 protects the semiconductor laminate 19 from short-circuit due to dust or the like and physical damages. As illustrated in FIG. 2, the second protection film 21 is formed covering the side faces and the upper face rim of the semiconductor laminate 19. Alternatively, the second protection film 21 may cover the whole upper face of the semiconductor laminate 19.

The thickness of the second protection film 21 is not particularly limited, and may be suitably adjusted according to desired properties. As with the insulation film 16 and the first protection film 18, the second protection film 21 may be made of, for example, an oxide film, a nitride film, an oxynitride film or the like containing at least one element selected from the group consisting of Si, Ti, V, Zr, Nb, Hf, Ta, Al and B. In particular, it may be made of $SiO_2$, $ZrO_2$, SiN, SiON, BN, SiC, SiOC, $Al_2O_3$, AlN, AlGaN, $Nb_2O_5$ or the like. Further, the second protection film 21 may be made of a monolayer or a laminated film of a single material, or a laminated film of different materials.

In the semiconductor light emitting element 1 having the above configuration, the recesses 191 are not formed at the contacts between the first electrode 15 and the first semiconductor layer 19a, i.e. in the areas above the protrusions 151, where electric current is likely to be concentrated. Therefore, in the semiconductor light emitting element 1, the first semiconductor layer 19a is thicker in the areas above the protrusions 151 than in the other areas. This can prevent the recesses 191 from interfering with electric current flow in the vicinity of the protrusions 151, and can thereby suppress the rise in resistance. Further in the semiconductor light emitting element 1, the first electrode 15 is in contact with the first semiconductor layer 19a at the protrusions 151. This can minimize a decrease of the area of the active layer 19c, and can thus ensure a comparatively large area for the active layer. Therefore, in the semiconductor light emitting element 1, the decrease in light extraction efficiency is suppressed.

(Manufacturing Method of Semiconductor Light Emitting Element)

A manufacturing method of the semiconductor light emitting element 1 according to the first embodiment of the present invention will be describe below with reference to FIGS. 5A through 7F (see FIGS. 1 to 4 for the structure). As with the FIG. 2, FIGS. 5A through 7F referred to in the following description are cross sectional views taken along the line A-A of FIG. 1, but illustrate only three sets of the through hole 20, the protrusion 151 of the first electrode 15 and the projected opening 161 of the insulation film 16, and the others are omitted.

Figure 5A:
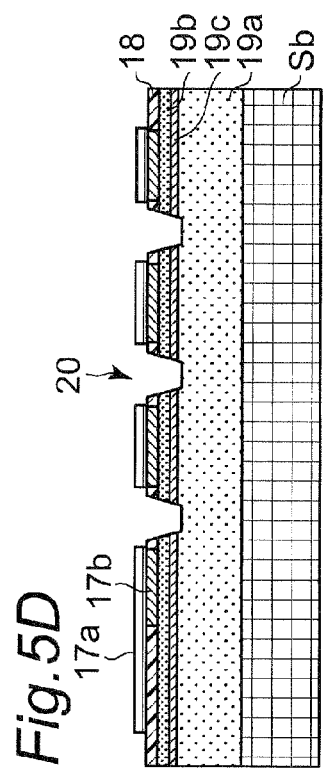
FIGS. 5A through 5F are schematic views illustrating a part of a manufacturing method of the semiconductor light emitting element according to the first embodiment of the present invention.
Figure 5B:
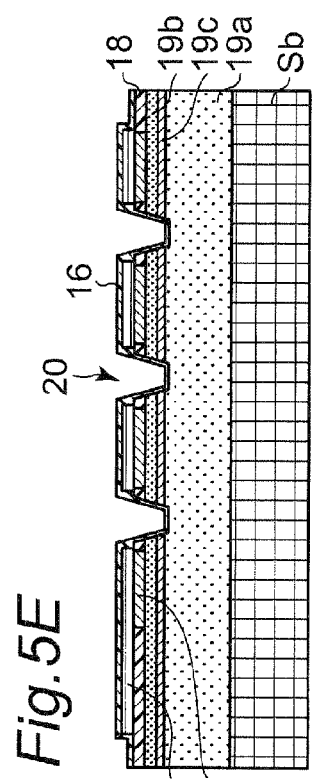
Figure 5C:
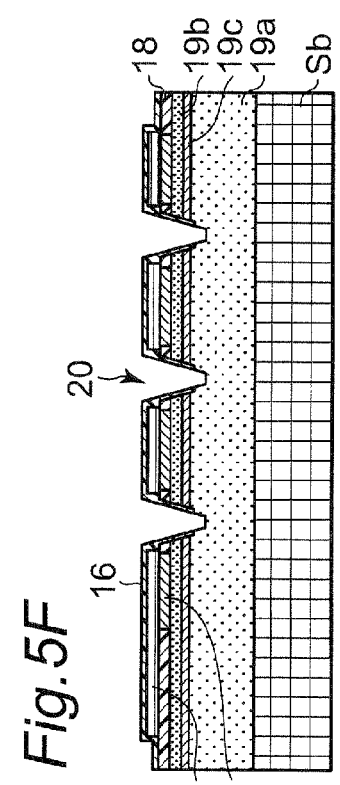

As illustrated in FIG. 5A, the manufacturing method of the semiconductor light emitting element 1 starts with forming the semiconductor laminate 19 composed of the first semiconductor layer 19a, active layer 19c and second semiconductor layer 19b on a sapphire substrate Sb by crystal growth, and then forming the internal connector 17b of the second electrode 17 on a predetermined area of the second semiconductor layer 19b, for example, by means of sputtering. Next, as illustrated in FIG. 5B, the manufacturing method of the semiconductor light emitting element 1 proceeds to forming the first protection film 18 between the internal connectors 17b on the second semiconductor layer 19b, for example, by means of sputtering. Next, as illustrated in FIG. 5C, the method manufacturing of the semiconductor light emitting element 1 proceeds to forming the lead 17a on a predetermined area of the internal connectors 17b and the first protection film 18, for example, by means of sputtering.

Figure 5D:
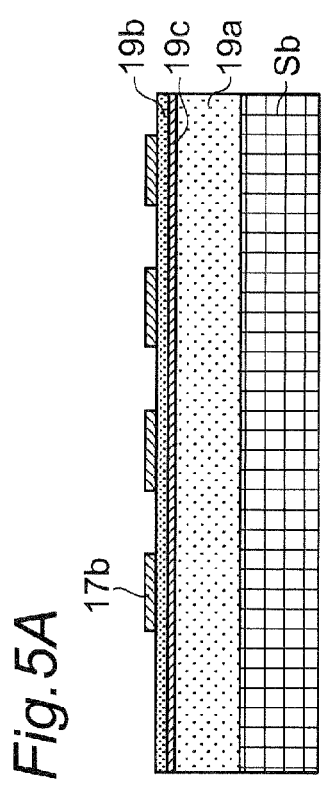
Figure 5E:
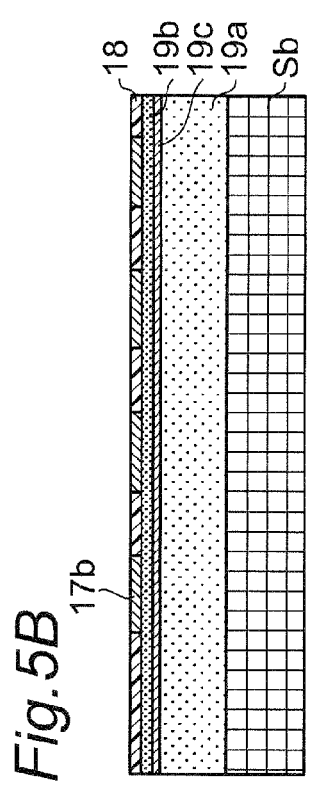
Figure 5F:
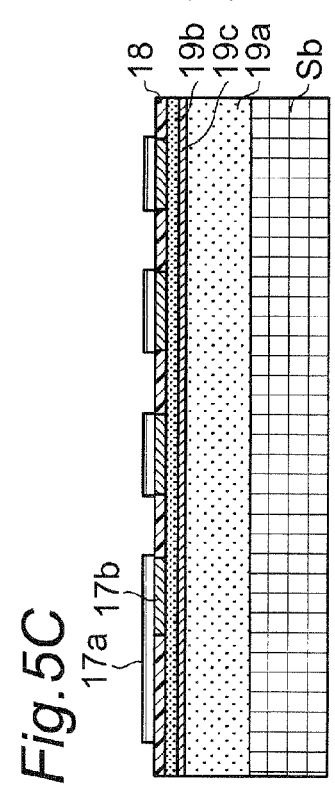

Next, as illustrated in FIG. 5D, the manufacturing method of the semiconductor light emitting element 1 proceeds to partly removing the first protection film 18, the second semiconductor layer 19b, the active layer 19c and the first semiconductor layer 19a, for example, by dry etching, so as to form the plurality of through holes 20. As mentioned above, the through holes 20 are formed for the protrusions 151 of the first electrode 15 and the projected openings 161 of the insulation film 16. Next, as illustrated in FIG. 5E, the manufacturing method of the semiconductor light emitting element 1 proceeds to forming the insulation film 16 on the lead 17a, on the first protection film 18 and in the through holes 20, for example, by means of sputtering. Next, as illustrated in FIG. 5F, the manufacturing method of the semiconductor light emitting element 1 proceeds to removing the part of the insulation film 16 on the first semiconductor layer 19a in the through holes 20, for example, by means of dry etching, so that the first semiconductor layer 19a is exposed.

Figure 6A:
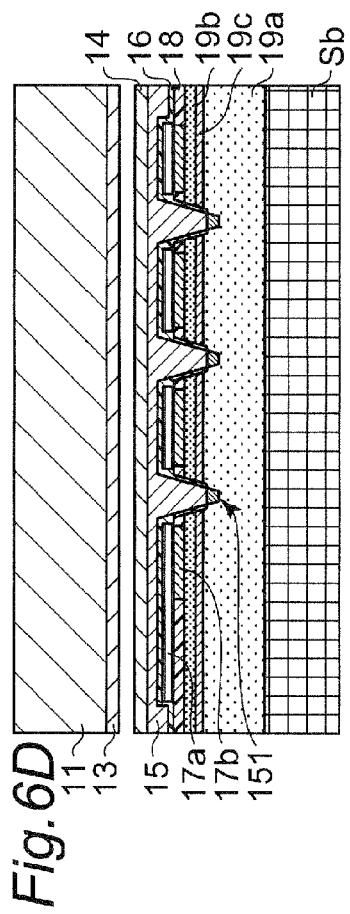
FIGS. 6A through 6F are schematic views illustrating a part of the manufacturing method of the semiconductor light emitting element according to the first embodiment of the present invention.
Figure 6B:
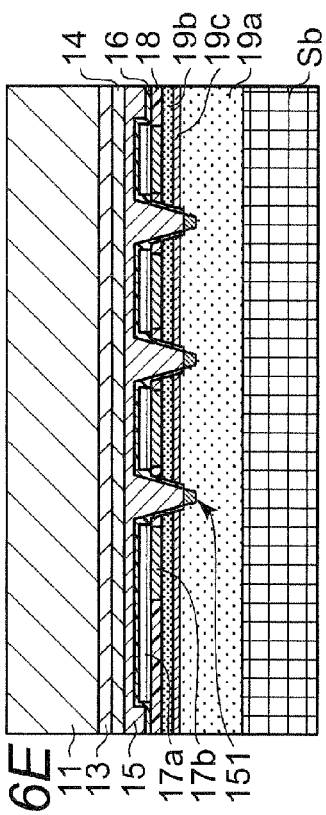
Figure 6C:
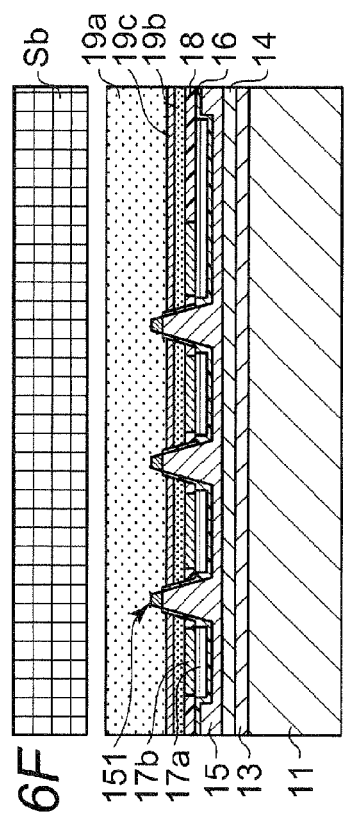

Next, as illustrated in FIG. 6A, the manufacturing method of the semiconductor light emitting element 1 proceeds to forming a comparatively thick layer of the first electrode 15 on the insulation film 16 and in the through holes 20, for example, by means of sputtering. In this step, the first electrode 15 may be formed such that the protrusion tips 151b that are in contact with the first semiconductor layer 19a is made of a different material from the material of the protrusion bodies 151a. That is, in the manufacturing method, the protrusion tips 151b are firstly formed in the through holes 20, and thereafter the first electrode 15 is formed in the through holes 20 and on the insulation film 16. Next, as illustrated in FIG. 6B, the manufacturing method of the semiconductor light emitting element 1 proceeds to flattening the first electrode 15 by polishing such as CMP (chemical mechanical polishing). Next, as illustrated in FIG. 6C, the manufacturing method of the semiconductor light emitting element 1 proceeds to forming the first electrode adhesion layer 14 on the flattened first electrode 15, for example, by means of sputtering.

Figure 6D:
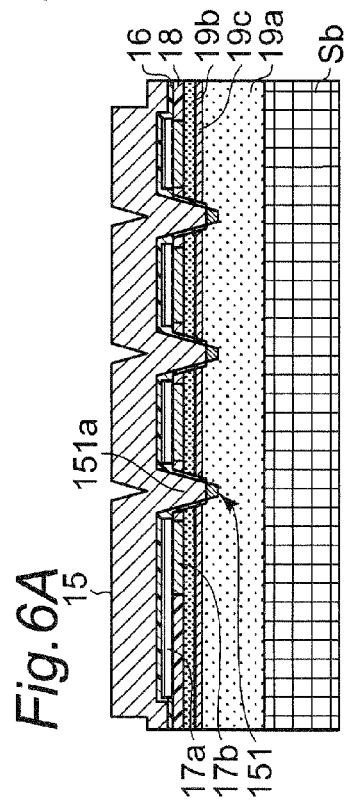
Figure 6E:
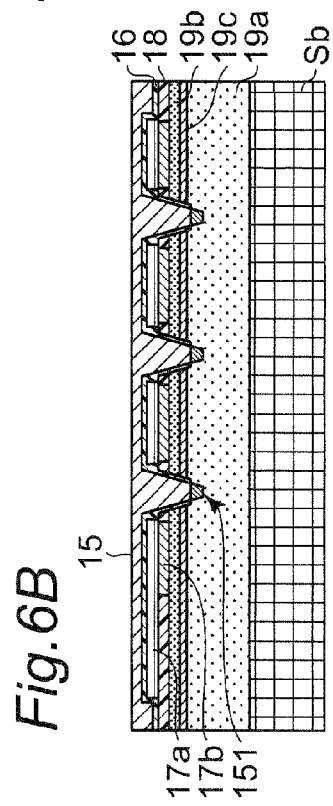
Figure 6F:
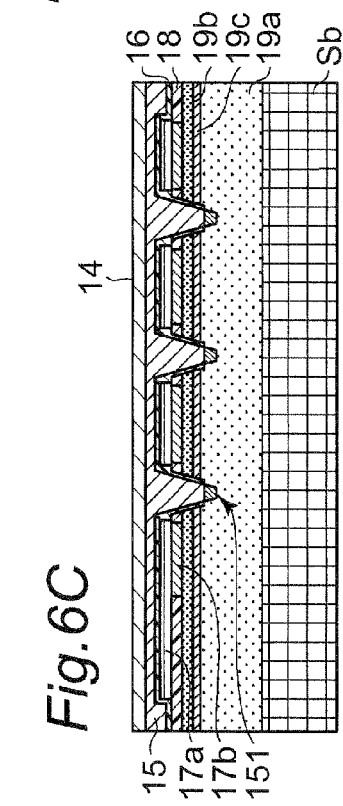

Next, as illustrated in FIG. 6D, the manufacturing method of the semiconductor light emitting element 1 proceeds to providing the substrate 11 on which the substrate adhesion layer 13 is formed, and then, as illustrated in FIG. 6E, bonding the substrate adhesion layer 13 of the substrate 11 and the first electrode adhesion layer 14 to each other. Next, as illustrated in FIG. 6F, the manufacturing method of the semiconductor light emitting element 1 proceeds to irradiating the element with laser light from the side of the sapphire substrate Sb according to the laser lift off method, so as to degrade the interface between the sapphire substrate Sb and the semiconductor laminate 19 (specifically, the first semiconductor layer 19a) to remove the sapphire substrate Sb. The above steps of FIGS. 5A through 6E are referred to as a "provision step" of the manufacturing method of the semiconductor light emitting element 1.

Next, as illustrated in FIG. 7A, the manufacturing method of the semiconductor light emitting element 1 proceeds to forming the plurality of recesses 191 on the upper face of the first semiconductor layer 19a in the areas other than the areas above the protrusions 151 and in the areas between the protrusions 151 by reactive ion etching (RIE). In this way, the fine recesses 191 can be formed on the upper face of the first semiconductor layer 19a. This step is referred to as a "recess forming step" of the manufacturing method of the semiconductor light emitting element 1.

In the recess forming step, a pattern of the recesses 191 may be formed by nanoimprint lithography. In the recess forming step, as illustrated in FIG. 7A, the peripheral area of the semiconductor laminate 19 is also etched until the first protection film 18 is exposed so that the side faces of the semiconductor laminate 19 is formed in a forward-tapered shape.

Next, as illustrated in FIG. 7B, the manufacturing method of the semiconductor light emitting element 1 proceeds to roughing the upper face of the first semiconductor layer 19a including the bottoms of the recesses 191 to form the rough surface 192, for example, by wet etching using a tetramethylammonium hydroxide (TMAH) solution. In this way, the finer rough surface 192 can be formed on the whole upper face of the first semiconductor layer 19a including the bottoms of the recesses 191. This step is referred to as a "rough surface forming step" of the manufacturing method of the semiconductor light emitting element 1.

Next, as illustrated in FIG. 7C, the manufacturing method of the semiconductor light emitting element 1 proceeds to etching the part of the first protection film 18 that is exposed from the semiconductor laminate 19, for example, by wet etching, so that the lead 17a is exposed. Next, as illustrated in FIG. 7D, the manufacturing method of the semiconductor light emitting element 1 proceeds to forming the external connector 17c on the exposed part of the lead 17a.

Next, as illustrated in FIG. 7E, the manufacturing method of the semiconductor light emitting element 1 proceeds to forming the second protection film 21 on the side faces of the semiconductor laminate 19, for example, by means of sputtering. Lastly, as illustrated in FIG. 7F, the manufacturing method of the semiconductor light emitting element 1 proceeds to forming the back face adhesion layer 12 on the lower face of the substrate 11, for example, by means of sputtering. Through the above steps, the semiconductor light emitting element 1 as illustrated in FIGS. 1 through 4 can be manufactured.

That is, the manufacturing method of the semiconductor light emitting element may include:

an element provision step including:

forming a semiconductor laminate using a growth substrate, the semiconductor laminate including a first semiconductor layer, an active layer and a second semiconductor layer;

forming a first electrode including a plurality of protrusions that penetrate the second semiconductor layer and the active layer; and forming a second electrode on a lower face of the second semiconductor layer;

a recess forming step of forming a plurality of recesses on an upper face of the first semiconductor layer in an area except for areas above the plurality of protrusions and in an area between the plurality of protrusions; and a rough surface forming step of forming a rough surface on the upper face of the first semiconductor layer including bottoms of the plurality of recesses.

By the manufacturing method of the semiconductor light emitting element including the above steps, the first semiconductor layer can be formed thicker in the areas above the protrusions than in the other areas. Therefore, it is possible to manufacture the semiconductor light emitting element in which the recesses do not interfere with electric current flow in the vicinity of the protrusions. Furthermore, in the manufacturing method of the semiconductor light emitting element, a decrease of the area of the active layer can be minimized by making the first electrode in contact with the first semiconductor layer at the protrusions, and a comparatively large area can be ensured for the active layer. Furthermore, by providing the rough surface on the whole upper face of the first semiconductor layer, it is possible to manufacture the semiconductor light emitting element that can diffuse the light in the whole upper face of the first semiconductor layer.

Second Embodiment

The configuration of a semiconductor light emitting element 1A according to a second embodiment of the present invention will be described with reference to FIG. 8. The semiconductor light emitting element 1A has the same configuration as the above semiconductor light emitting element 1 except for the position of protrusions 151 and projected openings 161. Therefore, the same part of the configuration and manufacturing method as those of the above semiconductor light emitting element 1 is omitted in the following description.

Figure 8:
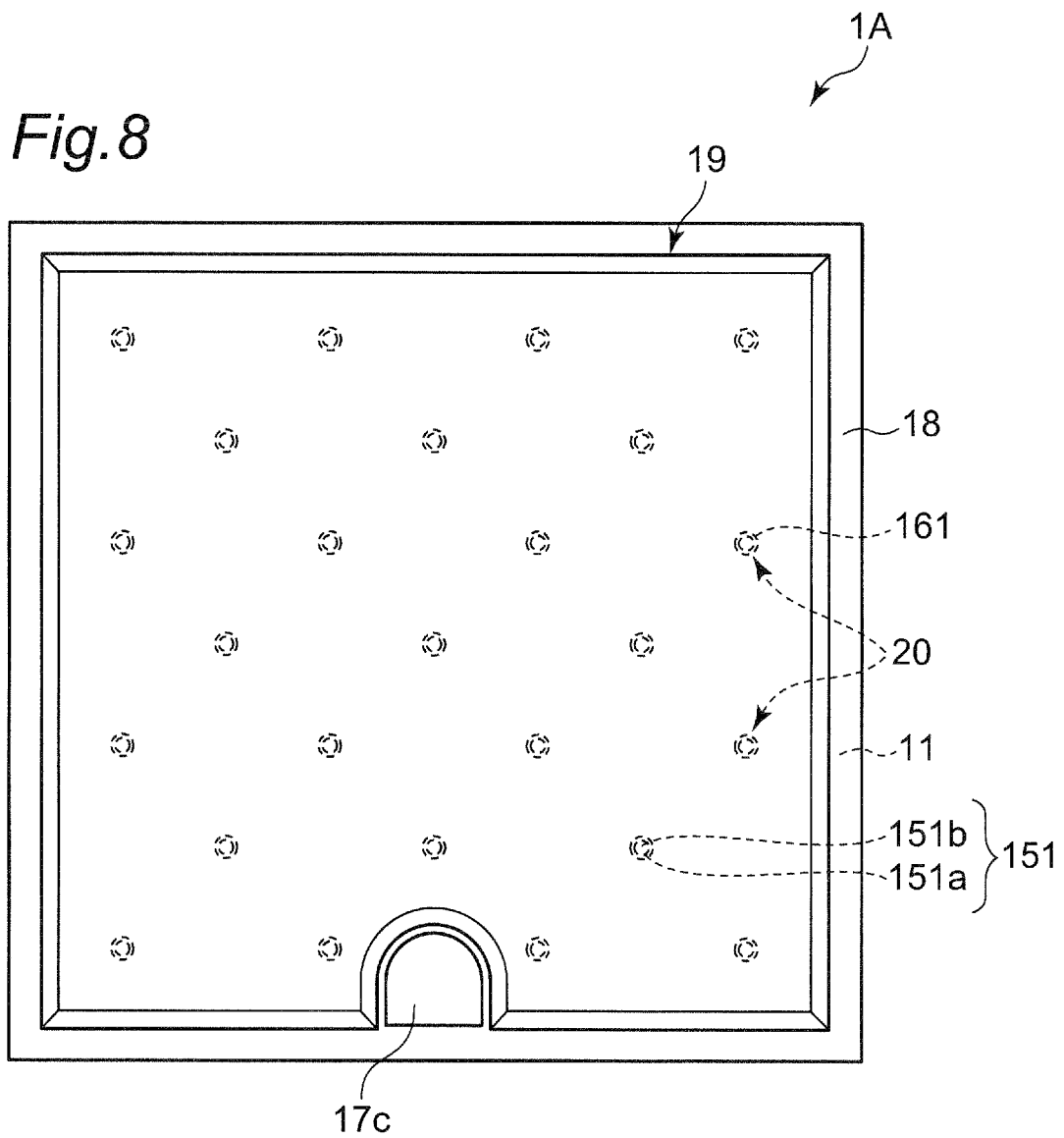
FIG. 8 is a plan view illustrating the overall structure of a semiconductor light emitting element according to a second embodiment of the present invention.

As illustrated in FIG. 8, in the semiconductor light emitting element 1A, the protrusions 151 are arranged in oblique directions in a plan view. That is, in the semiconductor light emitting element 1A, the protrusions 151 are arranged at regular intervals in the directions of the diagonal lines of the rectangular semiconductor light emitting element 1A in a plan view. Further, the protrusion openings 161 provided around the protrusions 151 are also arranged in the oblique directions corresponding to the protrusions 151. In the semiconductor light emitting element 1A having this configuration, because the plurality of protrusions 151 are regularly dispersed and arranged in oblique directions, electric current is likely to be evenly distributed over the first semiconductor layer 19a. Therefore, in the semiconductor light emitting element 1A, the rise in resistance in the first semiconductor layer 19a can be suppressed.

Third Embodiment

The configuration of a semiconductor light emitting element 1B according to a third embodiment of the present invention will be described with reference to FIG. 9. The semiconductor light emitting element 1B has the same configuration as the above semiconductor light emitting element 1 except for the shapes of protrusions 151A and projected openings 161A. Therefore, the same part of the configuration and manufacturing method as those of the above semiconductor light emitting element 1 is omitted in the following description.

Figure 9:
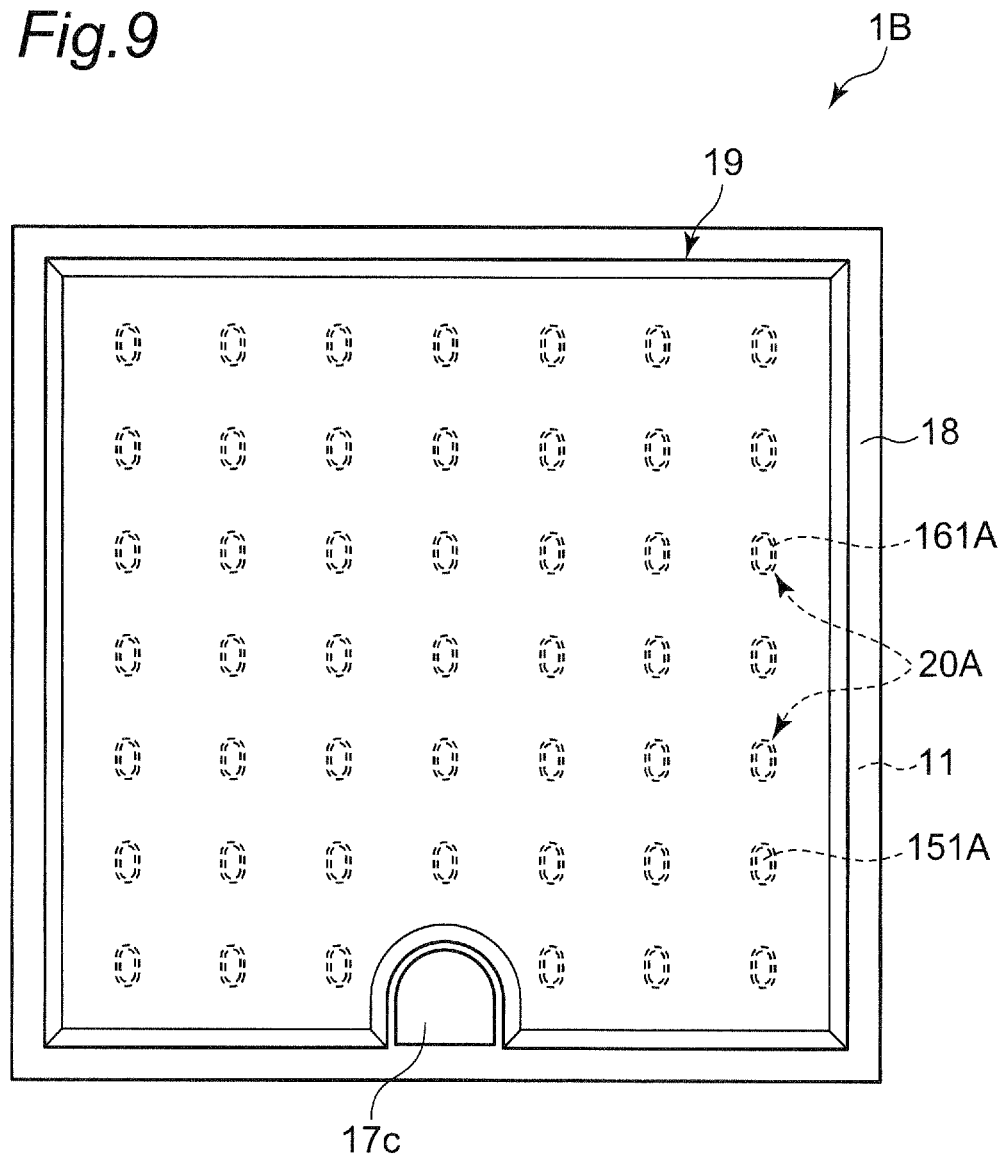
FIG. 9 is a plan view illustrating the overall structure of a semiconductor light emitting element according to a third embodiment of the present invention.

As illustrated in FIG. 9, in the semiconductor light emitting element 1B, the protrusions 151A are configured in an oval shape in a plan view. That is, in the semiconductor light emitting element 1B, the upper faces of the protrusions 151A are configured in an oval shape in a plan view, and the protrusions 151A are in contact with the first semiconductor layer 19a at these oval upper faces. Further, the projected openings 161A provided around the protrusions 151A are also configured in an oval shape corresponding to the protrusions 151A. In the semiconductor light emitting element 1B with this configuration, because the protrusions 151A are configured in an oval cross-sectional shape, the protrusions 151A have an increased contact area with the first semiconductor layer 19a, for example, compared to protrusions 151A having an exactly circular cross-sectional shape. Therefore, electric current is readily distributed over the first semiconductor layer 19a. As a result, in the semiconductor light emitting element 1B, the rise in resistance in the first semiconductor layer 19a can be suppressed.

Fourth Embodiment

The configuration of a semiconductor light emitting element 1C according to the fourth embodiment of the present invention will be described with reference to FIG. 10. The semiconductor light emitting element 1C has the same configuration as the above semiconductor light emitting element 1 except for the shapes of protrusions 151B and projected openings 161B. Therefore, the same part of the configuration and manufacturing method as those of the above semiconductor light emitting element 1 is omitted in the following description.

Figure 10:
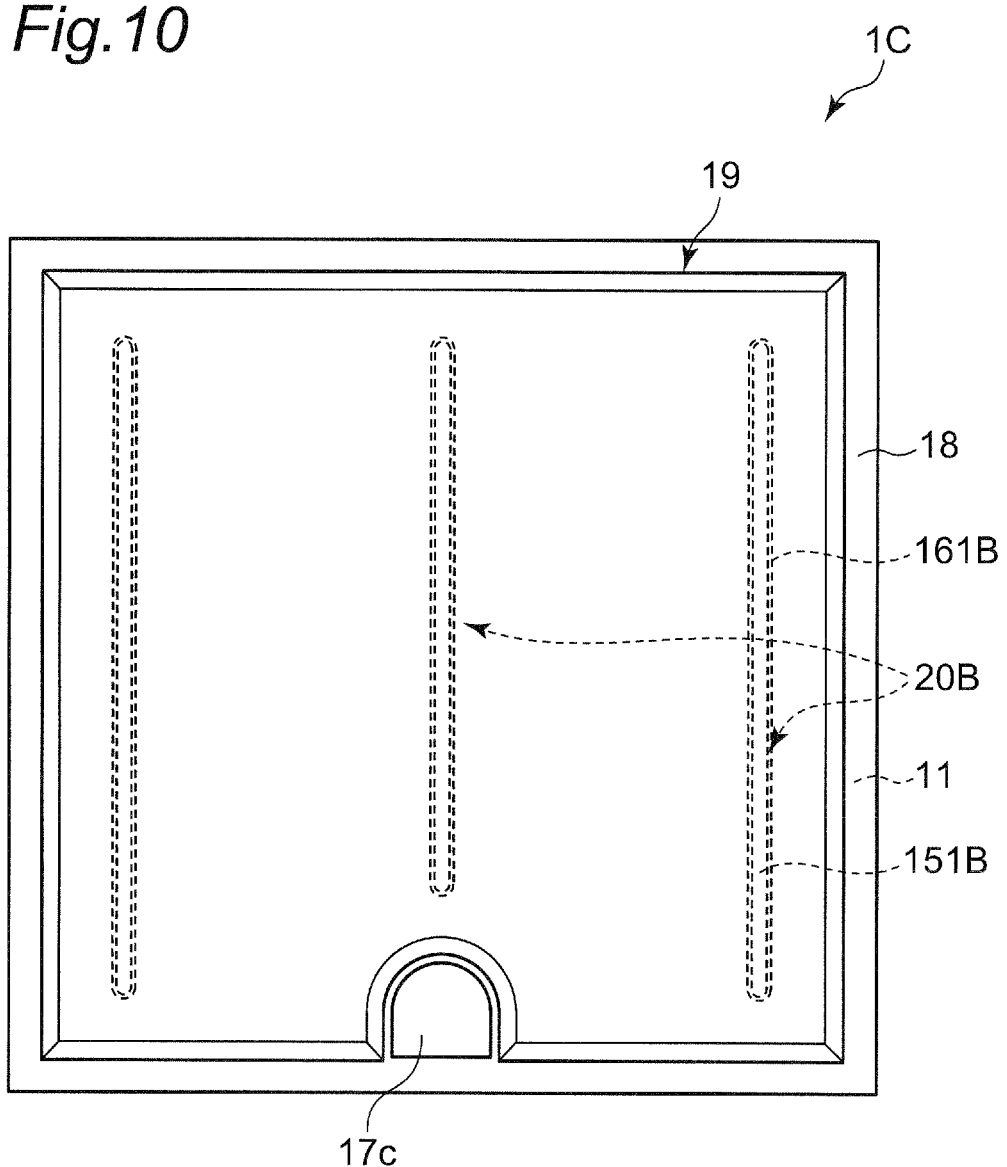
FIG. 10 is a plan view illustrating the overall structure of a semiconductor light emitting element according to a fourth embodiment of the present invention.

As illustrated in FIG. 10, in the semiconductor light emitting element 1C, the protrusions 151B are configured in a linear shape in a column direction or a row direction in a plan view. That is, in the semiconductor light emitting element 1C, the protrusions 151B are configured in a long oval shape as if protrusions 151 aligned in the row direction (length direction) of the semiconductor light emitting element 1C were all connected together, and are in contact with the first semiconductor layer 19a at the oval upper faces. Further, the projected openings 161B provided around the protrusions 151B are also configured in a linear shape corresponding to the protrusions 151B. In the semiconductor light emitting element 1C having this configuration, because the protrusions 151B are configured in a linear cross-sectional shape, the protrusions 151B have an increased contact area with the first semiconductor layer 19a, for example, compared to a plurality of point protrusions 151B. Therefore, electric current is readily distributed over the first semiconductor layer 19a. As a result, in the semiconductor light emitting element 1C, the rise in resistance in the first semiconductor layer 19a can be suppressed.

Fifth Embodiment

Figure 11A:
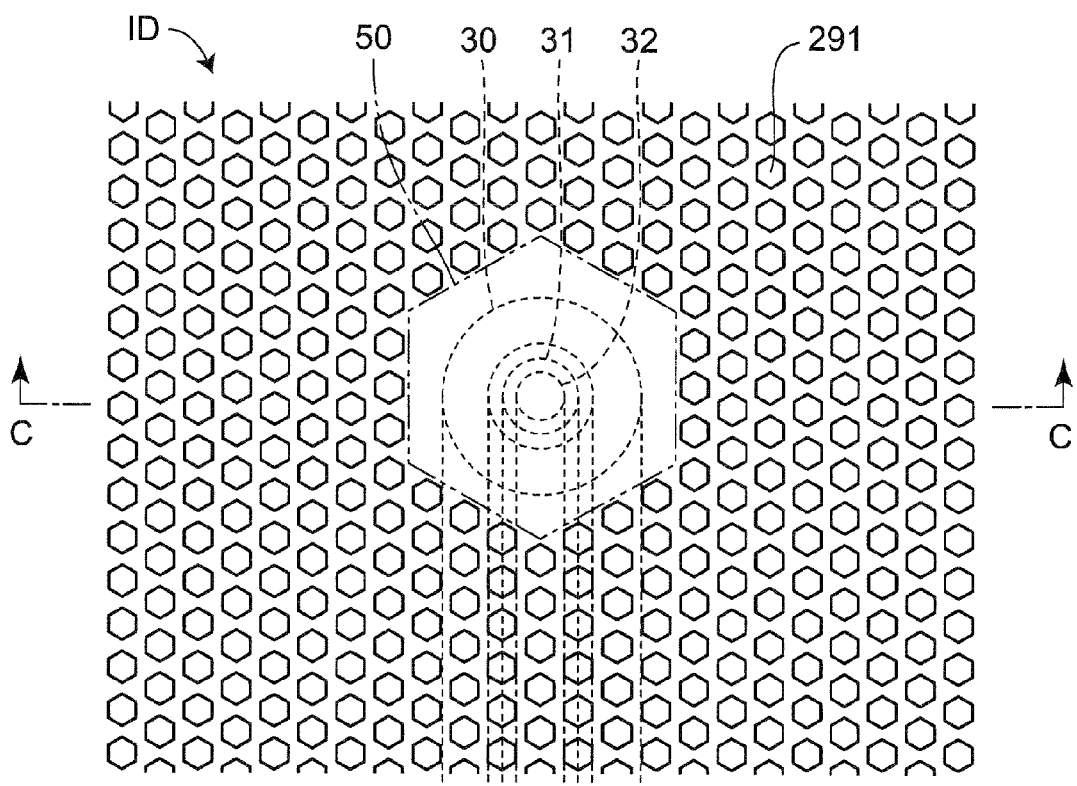
FIGS. 11A and 11B are enlarged views illustrating a part of a semiconductor light emitting element according to a fifth embodiment of the present invention, where
Figure 11B:
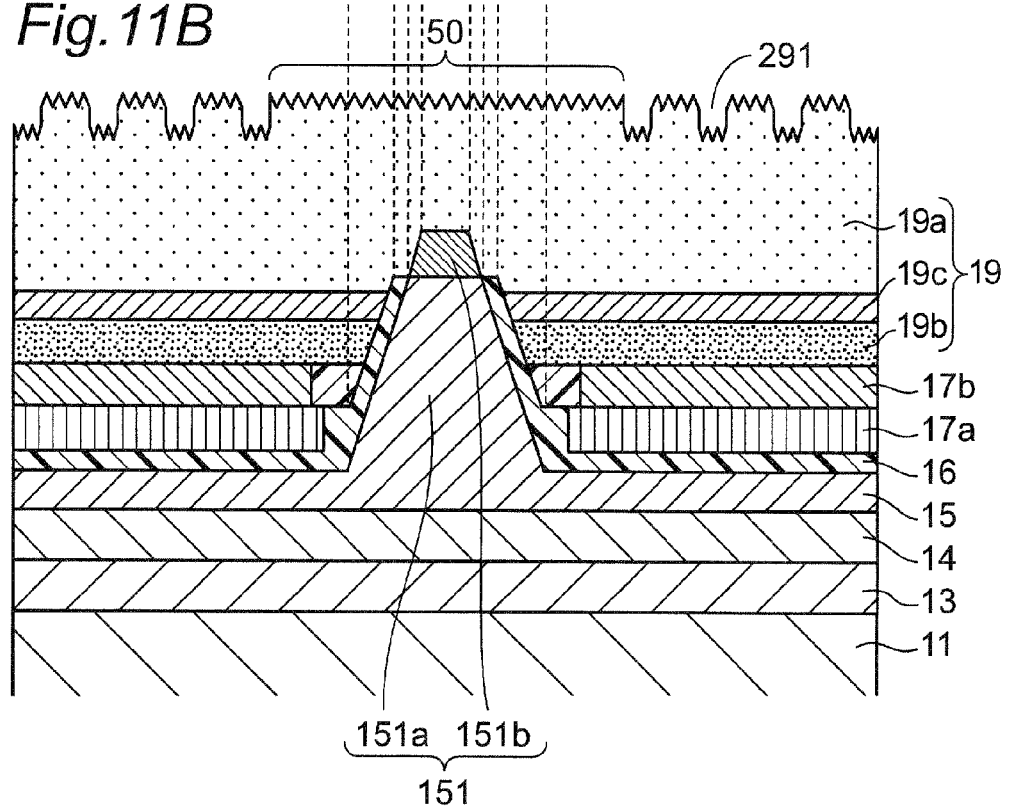

The configuration of a semiconductor light emitting element 1D according to a fifth embodiment of the present invention will be described with reference to FIGS. 11A and 11B. The semiconductor light emitting element 1D of the fifth embodiment has the same configuration as that of the first embodiment except that recesses 291 on the surface of a first semiconductor layer 19a are formed at a higher density than those of the semiconductor light emitting element 1 of the first embodiment. Therefore, the same components as those of the semiconductor light emitting element 1 of the first embodiment are indicated by the same reference signs in FIG. 11 as those in the FIGS. 1 to 3, and the description thereof is omitted. The manufacturing method thereof is also the same as that of the first embodiment, and the description thereof is omitted. As used herein, the term "the recesses 291 are formed at a higher density" means that the number of the recesses 291 is higher than the number of the recesses 191 per unit area. In the fifth embodiment, the recesses 291 are arranged at a high density such that the area of the bottom face of one of the recesses 291 is smaller than that of the first embodiment, and the distance between adjacent recesses 291 is narrower than the minimal width of the first regions 30. In detail, in the fifth embodiment, the recesses 291 are configured in a hexagonal planner shape having a maximal width of 8 μm, and are disposed at a density of 100 to 200 pieces per 100 μm² where the distance between adjacent recesses 291 is approximately 4 μm.

In more detail, in the semiconductor light emitting element 1D of the fifth embodiment, the upper face of the first semiconductor layer 19a includes first areas 30 corresponding to the projection images of protrusions 151 and a second area 60 excluding the first areas. The first area 30 includes areas 31 corresponding to the projection images of protrusion tips 151b on the upper face of the first semiconductor layer (if the protrusion tips 151b are configured in a cone frustum shape, the areas 31 (correspond to the projection images of the bottom faces of the protrusion tips 151b). Further, if the protrusion tips 151b are configured in a cone frustum shape, the areas 31 further include areas 32 corresponding to the projection images of the tip faces of the protrusion tips 151b.

In the semiconductor light emitting element 1D of the fifth embodiment, the recesses 291 are provided on the upper face of the first semiconductor layer 19a except for the areas 31 corresponding to the projection images of the protrusion tips 151b on the first semiconductor layer 19a, preferably on the second area excluding the first areas 30. More preferably, the recesses 291 are disposed such that the recesses 291 surrounding the first areas 30 are not in contact with the circumferences of the first areas 31 as illustrated in FIG. 11. That is, in the semiconductor light emitting element 1D of the fifth embodiment, by forming the recesses 291 surrounding the first areas 30 at a high density, convexes 50 are formed (defined) above the protrusion 151. It is preferred that the convexes 50 are formed covering the first areas 30, but may also be formed in or congruent to the first areas 30. As used herein, the term "the convexes 50 are formed covering the first areas 30" means that the recesses 291 are not in contact with the circumferences of the first areas 30 so that the convexes 50 include the first areas 30 in them. Further, in the semiconductor light emitting element 1D of the fifth embodiment, the recesses 291 are provided at intervals narrower than the minimal width of the first area. As used herein, the term "the minimal width of the first areas" refers to their diameter if the first areas 30 are configured in a circular shape. If the first areas 30 are configured in a rectangular shape, it refers to their short side length. If the first areas 30 are configured in a square shape, it refers to their side length. If the first areas 30 are configured in an oval shape, it refers to their short axis length.

In the semiconductor light emitting element 1D of the fifth embodiment having the above configuration, the recesses 291 are provided on the upper face of the first semiconductor layer 19a except for at least the areas 32. Therefore, as with the semiconductor light emitting element 1 of the first embodiment, this can suppress electric current concentration to the areas above the protrusions 151 in the first semiconductor layer 19a.

Further, in the semiconductor light emitting element 1D of the fifth embodiment, the recesses 291 are provided at such a high density that the distance between adjacent recesses 291 is narrower than the minimal width of the first areas. This can further improve the light extraction efficiency compared to the semiconductor light emitting element 1 of the first embodiment.

In the second area, because the recesses 291 are arranged at intervals narrower than the minimal width of the first areas, individual electric current paths, each of which is composed of a thicker part of the first semiconductor layer between the recesses 291, tend to have high resistance. However, in the semiconductor light emitting element of the fifth embodiment, because the recesses 291 are provided at a high density in the second area, there are a lot of electric paths, and the rise in resistance is suppressed as a whole. Therefore, in the semiconductor light emitting element 1D of the fifth embodiment, although the recesses 291 are provided at such a high density that the distance between adjacent recesses 291 is narrower than the minimal width of the first areas, the recesses 291 do not interfere with diffusion of electric current in the second area because the first semiconductor layer 19a includes a lot of thick portions (electric current paths) that are connected to each other, which can suppress a decrease in luminous intensity and poor uniformity of light emission that are likely to occur in an area apart from the protrusions. Therefore, in the semiconductor light emitting element of the fifth embodiment, the density of the recesses 291 can be optimized in the light of the light extraction efficiency while suppressing the decrease in luminous intensity and poor uniformity of light emission in an area apart from the protrusions 151.

Sixth Embodiment

Figure 12:
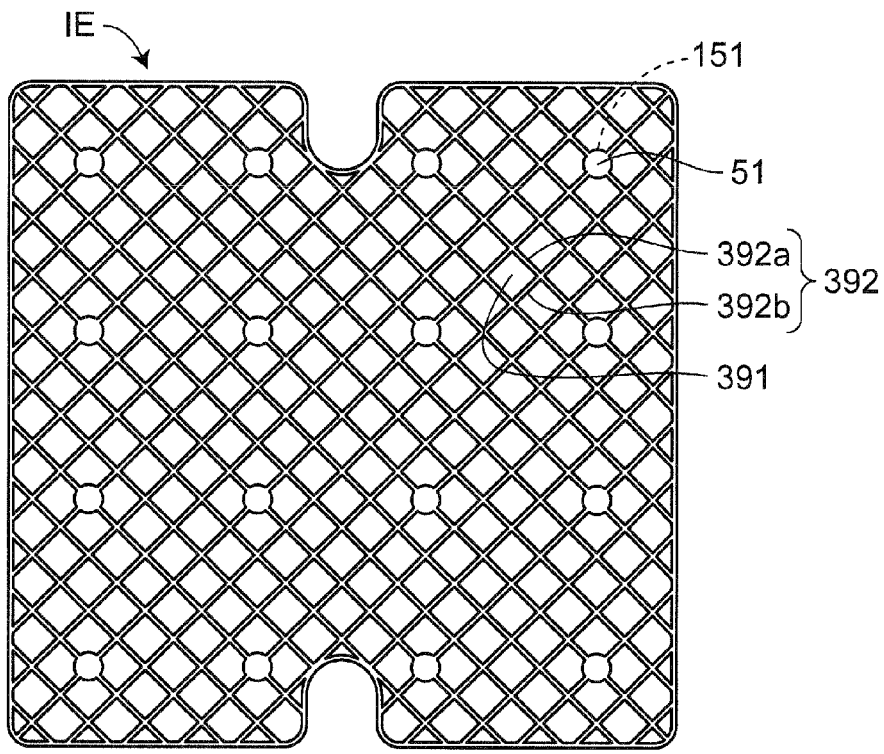
FIG. 12 is a plan view illustrating the overall structure of a semiconductor light emitting element according to a sixth embodiment of the present invention.

The configuration of a semiconductor light emitting element 1E according to a sixth embodiment of the present invention will be described with reference to FIG. 12. The semiconductor light emitting element 1E of the sixth embodiment has the same configuration as the semiconductor light emitting element 1 of the first embodiment except for the configuration of recesses 391 provided on the surface of a first semiconductor layer 19a. The configuration of the surface of the first semiconductor layer 19a, in particular the configuration of the recesses 391, which are different from those of the semiconductor light emitting element 1 of the first embodiment, will be described in detail below.

In the sixth embodiment, a first electrode 15 includes protrusions 151 arranged in a matrix as with the first embodiment. Corresponding to the protrusions 151 arranged in a matrix, respective first areas are defined on the surface of the first semiconductor layer 19a in a matrix. In the sixth embodiment, convexes 51 are provided on the upper face of the first semiconductor layer 19a in the first areas or covering the first areas. The first semiconductor layer 19a is thicker in the convexes 51 than in the other area. It is preferred that the centers of the convexes 51 coincide with the centers of the first areas. Accordingly, the convexes 51 are arranged on the surface of the semiconductor layer 19a in a matrix as with the protrusions 151. As illustrated in FIG. 12, the convexes 51 of the fifth embodiment having the above configuration are arranged on the surface of the first semiconductor layer 19*a* such that their centers coincide with the grid points of a square grid.

In the second area, the plurality of recesses 391 are provided which are partitioned by partition walls 392. The partition walls 392 include: (a) first partition walls 392*a* that are provided in one of the diagonal directions of the square grid; and (b) second partition walls 392*b* that are provided in the other of the diagonal directions of the square grid. The first partition walls 392*a* and the second partition walls 392*b* are continuously connected to each other at the intersections, and define the recesses 391 that are partitioned by the first partition walls 392*a* and the second partition walls 392*b*. Some of the first partition walls 392*a* connect convexes 51 aligned in one of the diagonal directions to each other among the convexes 51 that are formed at the respective plurality of first areas by thickening the first semiconductor layer. Similarly, some of the second partition walls 392*b* connect convexes 51 aligned in the other of the diagonal directions to each other among the convexes 51.

In the sixth embodiment, there are also the first partition walls 392*a* that are not directly connected to the convexes 51 in addition to the first partition walls 392*a* that connect the convexes 51 aligned in one diagonal direction to each other. Similarly, there are also the second partition walls 392*b* that are not directly connected to the convexes 51 in addition to the second partition walls 392*b* that connect the convexes 51 aligned in the other diagonal direction to each other. In the semiconductor light emitting element of the sixth embodiment having the above configuration, the recesses are formed at a high density, and the number thereof is higher than the number of the convexes (first areas). For example, in the example illustrated in FIG. 12, there are two first partition walls 392*a* that are not directly connected to the convexes 51 between two first partition walls 392*a* that connect the convexes 51 aligned in one diagonal direction. Also, there are two second partition walls 392*b* that are not directly connected to the convexes 51 between two second partition walls 392*b* that connect the convexes 51 aligned in the other diagonal direction. Therefore, the number of the recesses 391 is seven or more times higher than the number of the convexes 51 (or first areas). The first partition walls 392*a* that are not directly connected to the convexes 51 are connected to the convexes 51 via the second partition walls 392*b*, and the second partition walls 392*b* that are not directly connected to the convexes 51 are connected to the convexes 51 via the first partition walls 392*a*.

In the semiconductor light emitting element 1E of the sixth embodiment having the above configuration, the convexes 51 are provided on the upper face of the first semiconductor layer 19*a* in the areas above the protrusions 151 so that the first semiconductor layer 19*a* becomes thicker than in the other area. As with the semiconductor light emitting element 1 of the first embodiment, this can suppress concentration of electric current to the above of the protrusions 151 in the first semiconductor layer 19*a*.

Further, in the semiconductor light emitting element 1E of the sixth embodiment, because the recesses 391 are formed at a high density, the light extraction efficiency can be further improved compared to the semiconductor light emitting element 1 of the first embodiment.

Further, in the semiconductor light emitting element 1E of the sixth embodiment, the first semiconductor layer is thick in the portions with the first partition walls 392*a* or the second partition walls 392*b*. Accordingly, these first partition walls 392*a* and second partition walls 392*b* form an electric current path grid (mesh). Therefore, in the semiconductor light emitting element of the sixth embodiment, the electric current path grid (mesh) composed of the first partition walls 392*a* and second partition walls 392*b* can diffuse concentrated electric current around the convexes 51 in the lateral direction so as to suppress the rise in resistance in the first semiconductor layer 19*a*. Further, a decrease in luminous intensity and poor uniformity of light emission that are likely to occur in an area apart from the protrusions can be suppressed. Therefore, in the semiconductor light emitting element of the sixth embodiment, the density of the recesses 391 can be optimized in the light of the light extraction efficiency while suppressing the decrease in luminous intensity and poor uniformity of light emission in an area apart from the protrusions 151.

Furthermore, in the semiconductor light emitting element 1E of the sixth embodiment, the number of the recesses 391 (the density of the recesses 391) can be readily adjusted by setting the number of the first partition walls 392*a* that are not directly connected to the convexes 51 and the number of the second partition walls 392*b* that are not directly connected to the convexes 51.

Seventh Embodiment

Figure 13:
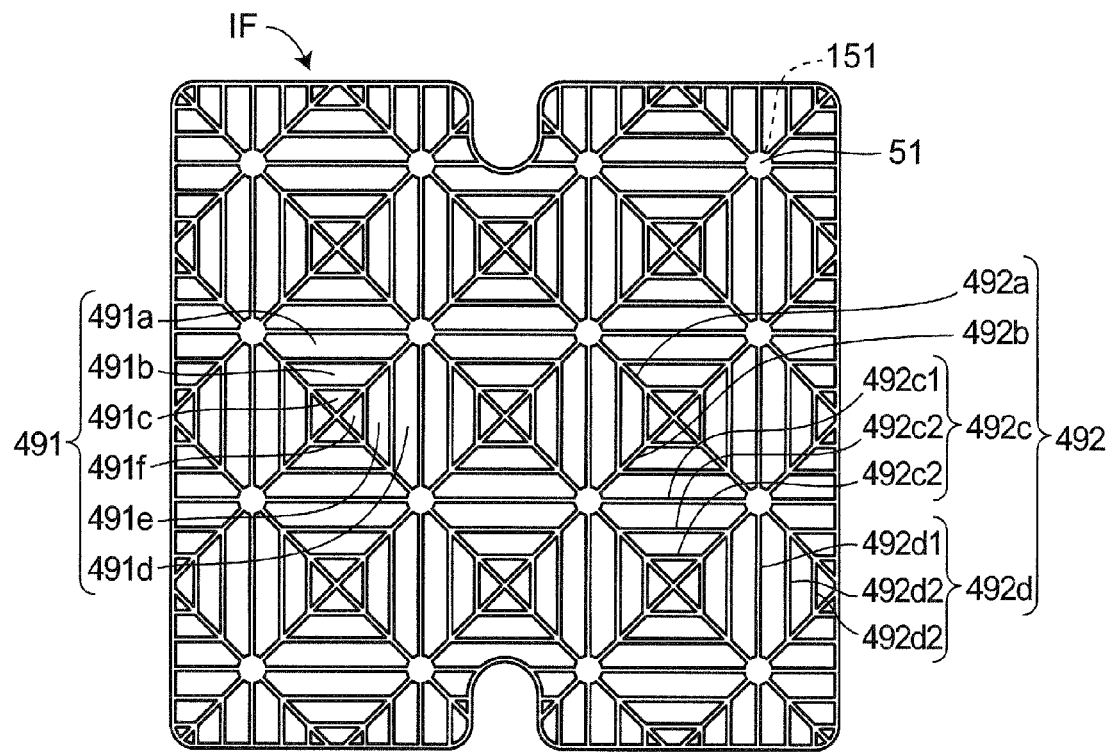
FIG. 13 is a plan view illustrating the overall structure of a semiconductor light emitting element according to a seventh embodiment of the present invention.

The configuration of a semiconductor light emitting element 1F according to a seventh embodiment of the present invention will be described with reference to FIG. 13. The semiconductor light emitting element of the seventh embodiment is the same as that of the sixth embodiment in that a plurality of convexes 51 are formed respectively in a plurality of first areas or covering the plurality of first areas, and their centers coincide with the grid points of a square grid. However, it is different from the sixth embodiment in the shape of partition walls 492 in a plan view. Still, it is the same as the sixth embodiment in that the plurality of recesses 491 are formed in a second area excluding a first area, and are partitioned by the partition walls 492.

In the semiconductor light emitting element of the seventh embodiment, the partition walls 492 include: (a) first partition walls 492*a* in one of the diagonal directions of the square grid; (b) second partition walls 492*b* in the other of the diagonal directions of the square grid; (c) third partition walls 492*c* in the direction parallel to a side of the square grid; and (d) fourth partition walls 492*d* in the direction perpendicular to the side of the square grid.

The first partition walls 492*a* connect the convexes 51 aligned in one of the diagonal directions to each other among the convexes 51 that are formed by thickening the first semiconductor layer 19*a* at the respective plurality of first areas. Similarly, the second partition walls 492*b* connect the convexes 51 aligned in the other of the diagonal directions to each other.

The third partition walls 492*c* includes at least third partition walls 492*c*1 that connect adjacent convexes 51 to each other, and may further include third partition walls 492*c*2 that connect a first partition wall 492*a* to a second partition wall 492*b*. The fourth partition walls 492*d* are formed perpendicular to a side of the square grid, and includes at least fourth partition walls 492*d*1 that connect adjacent convexes 51 to each other, and may further include fourth partition walls 492*d*2 that connect a first partition wall 492*a* to a second partition wall 492*b*.

Accordingly, 12 recesses 491 are formed in each unit area, i.e. each unit grid. Specifically, each unit area includes the following 12 recesses 491 in total at a high density:

(a) two recesses 491*a* that are surrounded by a third partition wall 492*c*1, a third partition wall 492*c*2, a first partition wall 492*a* and a second partition wall 492*b*, and have a trapezoidal planner shape;

(b) two recesses 491*b* that are surrounded by two third partition wall 492*c*2, a first partition wall 492*a* and a second partition wall 492*b*, and have a trapezoidal planner shape;

(c) two recesses 491*c* that are surrounded by a third partition wall 492*c*2, a first partition wall 492*a* and a second partition wall 492*b*, and have a triangular planner shape;

(d) two recesses 491*d* that are surrounded by a fourth partition wall 492*d*1, a fourth partition wall 492*d*2, a first partition wall 492*a* and a second partition wall 492*b*, and have a trapezoidal planner shape;

(e) two recesses 491*e* that are surrounded by two fourth partition walls 492*d*2, a first partition wall 492*a* and a second partition wall 492*b*, and have a trapezoidal planner shape; and (f) two recesses 491*f* that are surrounded by a fourth partition wall 492*d*2, a first partition wall 492*a* and a second partition wall 492*b*, and have a triangular planner shape.

In the semiconductor light emitting element 1F of the seventh embodiment having the above configuration, the convexes 51 are provided on the upper face of the first semiconductor layer 19*a* in the areas above the protrusions 151 so that the first semiconductor layer 19*a* becomes thicker than in the other area. As with the semiconductor light emitting element 1 of the first embodiment, this can suppress concentration of electric current to the above of the protrusions 151 in the first semiconductor layer 19*a*.

Further, in the semiconductor light emitting element 1F of the seventh embodiment, because the recesses 491 are formed at a high density, the light extraction efficiency can be further improved compared to the semiconductor light emitting element 1 of the first embodiment.

Further, in the semiconductor light emitting element 1F of the seventh embodiment, the first semiconductor layer 19*a* is thick in the portions with the first partition walls 492*a*, the second partition walls 492*b*, the third partition walls 492*c* and the fourth partition walls 492*d*. Accordingly, these first partition walls 492*a*, second partition walls 492*b*, third partition walls 492*c* and fourth partition walls 492*d* form an electric current path grid (mesh) having a low electric resistance. In the semiconductor light emitting element of the seventh embodiment, this electric current path grid (mesh) can diffuse the concentrated electric current around the convexes 51 in the lateral direction so as to suppress the rise in resistance in the first semiconductor layer 19*a*. Further, a decrease in luminous intensity and poor uniformity of light emission in an area apart from the protrusions can be suppressed. Therefore, in the semiconductor light emitting element of the seventh embodiment, the density of the recesses 491 can be optimized in the light of the light extraction efficiency while suppressing the decrease in luminous intensity and poor uniformity of light emission in an area apart from the protrusions 151.

Furthermore, in the semiconductor light emitting element 1F of the seventh embodiment, the number of the recesses 491 (the density of the recesses 491) can be readily adjusted by setting the number of the third partition walls 492*c*2 that connect a first partition wall 492*a* to a second partition wall 492*b* and the number of the fourth partition walls 492*d*2 that connect a first partition wall 492*a* to a second partition wall 492*b*.

While the semiconductor light emitting elements and the manufacturing methods thereof according to the present invention have been specifically described with the embodiments and examples, the scope of the present invention is not limited to those descriptions, and shall be broadly construed based on the recitation of the claims. Further, it is understood that various variations and modifications according to these descriptions are also included in the scope of the present invention.

In the above semiconductor light emitting elements 1, 1A, 1B, 1C, 1D, 1E and 1F, a coating member may be provided on the semiconductor laminate 19 by plating, and it may be used as the substrate 11 or the substrate adhesion layer 13. Further, the semiconductor light emitting elements 1, 1A, 1B, 1C, 1D, 1E and 1F may not be provided with the substrate 11. For example, a semiconductor light emitting element 1, 1A, 1B, 1C, 1D, 1E and 1F with no substrate 11 may be directly mounted on a mount or a base of a light emitting device (not shown).

In the above semiconductor light emitting elements 1, 1A, 1B, 1C, 1D, 1E and 1F, the side faces of the semiconductor laminate 19 are inclined in a forward-tapered shape as illustrated in FIG. 2. However, the side faces of the semiconductor laminate 19 may be inclined in an inverted tapered shape. In a semiconductor light emitting elements 1, 1A, 1B and 1C of this case, the side faces (specifically, inner side faces) of the semiconductor laminate 19 can reflect the light emerging from the active layer 19*c* so as to extract it from the upper portion of the semiconductor light emitting elements 1, 1A, 1B, 1C, 1D, 1E and 1F.

In the above semiconductor light emitting elements 1, 1A, 1B, 1C, 1D, 1E and 1F, the side faces of the semiconductor laminate 19 are inclined in a forward tapered shape as illustrated in FIG. 2. However, they may not be inclined in a tapered shape.

In the above semiconductor light emitting elements 1, 1A, 1B, 1C, 1D, 1E and 1F, the recesses 191 are configured in a hexagonal shape as illustrated in FIG. 2. However, they may also be configured indifferent shapes such as other polygonal shapes, round shape and oval shape.

The semiconductor light emitting elements according to the present invention are applicable to, for example, illumination light sources, light sources of various indicators, vehicle light sources, display light sources, light sources of LCD back light, sensor light sources and traffic signals.

DESCRIPTION OF REFERENCE SYMBOLS

1, 1A, 1B, 1C, 1D, 1E and 1F: Semiconductor light emitting element
11: Substrate
12: Back face adhesion layer
13: Substrate adhesion layer
14: First electrode adhesion layer
15: First electrode
20: Through hole
21: Second protection film
30: First area
31, 32: Area
60: Second area
50, 51: Convex
151, 151A, 151B: Protrusion
151*a*: Protrusion body
151*b*: Protrusion tip
16: Insulation film
161, 161A, 161B: Projected opening
17: Second electrode
17*a*: Lead
17*b*: Internal connector
17*c*: External connector
18: First protection film (light reflector)
19: Semiconductor laminate 19a: First semiconductor layer
19b: Second semiconductor layer
19c: Active layer
191, 291, 391, 491, 491a, 491b, 491c, 491d, 491e, 491f: Recess
192: Rough surface
392, 492: Partition wall
392a, 492a: First partition wall
392b, 492b: Second partition wall
492c, 492c1, 492c2: Third partition wall
492d, 492d1, 492d2: Fourth partition wall
Sb: Sapphire substrate

What is claimed is:

1. A semiconductor light emitting element comprising:
a semiconductor laminate including a first semiconductor layer, an active layer and a second semiconductor layer which are laminated in descending order from an upper face to a lower face;
a first electrode including a plurality of protrusions that penetrate the second semiconductor layer and the active layer, the first electrode being connected to the first semiconductor layer via the plurality of protrusions;
a second electrode connected to the second semiconductor layer on an lower face of the second semiconductor layer; and
an insulation film disposed between the plurality of protrusions and the semiconductor laminate,
wherein the plurality of protrusions each include a protrusion body covered with the insulation film and a protrusion tip on the protrusion body, an upper face and a side face of the protrusion tip being exposed from the insulation film,
the first semiconductor layer includes a plurality of recesses that are arranged on an upper face of the first semiconductor layer so as to sandwich first areas located above the respective plurality of protrusions, and a distance between the recesses sandwiching the first area is larger than a width of the protrusion tip.

2. The semiconductor light emitting element according to claim 1, wherein each of the protrusion tips has an area of an upper face smaller than an area of a bottom face.

3. The semiconductor light emitting element according to claim 1, wherein the protrusion tips are made of a different material from the protrusion bodies.

4. The semiconductor light emitting element according to claim 1, wherein the protrusion tips include at least one of Ag, Al and Ti.

5. The semiconductor light emitting element according to claim 1, wherein the recesses are formed in an area above a region between the protrusions.

6. The semiconductor light emitting element according to claim 1, wherein the upper face of the first semiconductor layer including bottoms of the plurality of recesses has rough surface that irregularity is smaller than irregularity formed by the recesses.

7. The semiconductor light emitting element according to claim 1, wherein the protrusions are arranged in columns and rows to form a matrix in a plan view.

8. The semiconductor light emitting element according to claim 1, further comprising a substrate under the first electrode for supporting the semiconductor laminate.

* * * * *